United States Patent
Nagasawa et al.

(10) Patent No.: US 10,341,475 B2
(45) Date of Patent: Jul. 2, 2019

(54) DISPLAY UNIT, METHOD OF MANUFACTURING THE SAME, AND ELECTRONIC APPARATUS

(71) Applicant: Sony Corporation, Tokyo (JP)

(72) Inventors: Koichi Nagasawa, Kanagawa (JP); Hirofumi Fujioka, Aichi (JP); Tomoki Sato, Aichi (JP); Tomotaka Nishikawa, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/629,414

(22) Filed: Jun. 21, 2017

(65) Prior Publication Data
US 2017/0289325 A1   Oct. 5, 2017

Related U.S. Application Data

(63) Continuation of application No. 15/387,114, filed on Dec. 21, 2016, now Pat. No. 9,712,651, which is a
(Continued)

(30) Foreign Application Priority Data

Jan. 28, 2013   (JP) .................................. 2013-013555

(51) Int. Cl.
*H01L 27/32*   (2006.01)
*H04M 1/02*   (2006.01)
(Continued)

(52) U.S. Cl.
CPC ........ *H04M 1/0266* (2013.01); *H01L 27/124* (2013.01); *H01L 27/3248* (2013.01);
(Continued)

(58) Field of Classification Search
CPC ............ H01L 27/3276; H01L 27/3248; H01L 27/3262
See application file for complete search history.

(56) References Cited

U.S. PATENT DOCUMENTS

2005/0001963 A1   1/2005   Yokoyama
2005/0218794 A1*  10/2005  Seo ..................... H01L 51/5271
                                                          313/504
(Continued)

FOREIGN PATENT DOCUMENTS

| CN | 1307479 | 1/2005 |
|---|---|---|
| CN | 101276797 | 10/2008 |
| JP | 09-127555 | 5/1997 |

OTHER PUBLICATIONS

Chinese Office Action dated Feb. 5, 2018 in corresponding Chinese Application No. 2017102501268.
(Continued)

*Primary Examiner* — Trang Q Tran
(74) *Attorney, Agent, or Firm* — K&L Gates LLP

(57) ABSTRACT

A display unit includes: a display layer including a pixel electrode; a semiconductor layer provided in a layer below the display layer, the semiconductor layer including a wiring layer that includes a material removable by an etchant by which the pixel electrode is also removable; and a terminal section configured to electrically connect the semiconductor layer to an external circuit, the terminal section including a first electrically-conductive layer made of a material same as a material of the wiring layer.

5 Claims, 38 Drawing Sheets

Related U.S. Application Data continuation of application No. 14/884,474, filed on Oct. 15, 2015, now Pat. No. 9,548,346, which is a continuation of application No. 14/155,703, filed on Jan. 15, 2014, now Pat. No. 9,219,081.

(51) Int. Cl.
  *H01L 27/12* (2006.01)
  *H01L 51/52* (2006.01)
  *H01L 51/00* (2006.01)
  *H04B 1/3827* (2015.01)

(52) U.S. Cl.
  CPC ...... *H01L 27/3262* (2013.01); *H01L 27/3276* (2013.01); *H01L 51/0096* (2013.01); *H01L 51/5203* (2013.01); *H01L 51/5215* (2013.01); *H01L 51/5253* (2013.01); *H04B 1/3833* (2013.01); *H01L 2251/301* (2013.01); *H01L 2251/308* (2013.01)

(56) References Cited

U.S. PATENT DOCUMENTS

| | | |
|---|---|---|
| 2007/0170434 A1 | 7/2007 | Inoue et al. |
| 2007/0295967 A1 | 12/2007 | Harada |
| 2009/0194780 A1* | 8/2009 | Kwon ................. H01L 27/3246 257/98 |
| 2009/0256820 A1 | 10/2009 | Yanase et al. |
| 2011/0241003 A1 | 10/2011 | Yamazaki et al. |

OTHER PUBLICATIONS

Chinese Office Action dated Feb. 8, 2018 in corresponding Chinese Application No. 2014100284126.

Chinese Office Action dated Nov. 5, 2018 in corresponding Chinese Application No. 2017102501268.

* cited by examiner

DISPLAY UNIT, METHOD OF MANUFACTURING THE SAME, AND ELECTRONIC APPARATUS

CROSS REFERENCES TO RELATED APPLICATIONS

The present application is a continuation of U.S. patent application Ser. No. 15/387,114, filed on Dec. 21, 2016, which application is a continuation of U.S. patent application Ser. No. 14/884,474, filed on Oct. 15, 2015, and issued as U.S. Pat. No. 9,548,346 on Jan. 17, 2017, which application is a continuation of U.S. patent application Ser. No. 14/155,703, filed on Jan. 15, 2014, and issued as U.S. Pat. No. 9,219,081 on Dec. 22, 2015, which application claims priority to Japanese Priority Patent Application JP 2013-013555 filed in the Japan Patent Office on Jan. 28, 2013, the entire content of which is hereby incorporated by reference.

BACKGROUND

The present application relates to a display unit having a semiconductor layer provided, for example, with a thin film transistor (TFT), to a method of manufacturing the same, and to an electronic apparatus including the display unit.

A display unit such as an organic electro luminescence (EL) display unit is a display device in which luminance is controlled by a current flowing in an organic light-emitting diode. Therefore, in such a display unit, there is a disadvantage that unevenness in characteristics of a low-temperature polysilicon TFT generally used as a switching element is easily expressed as display unevenness.

To resolve the foregoing disadvantage, in an organic EL display unit of recent years, a method of resolving unevenness in characteristics of a TFT to improve display performance by devising a drive circuit has been reported. In contrast, for reasons such as that, in the organic EL display unit, for example, the number of TFTs used therein and the number of wiring circuits used therein are increased compared to in a liquid crystal display unit, the area of a capacitor is increased, and thereby, the circuit of the organic EL display unit is complicated. Therefore, in the organic EL display unit, there have been disadvantages that the layout space is tight, the number of short-circuit faults is increased, and the yield is lowered.

A short-circuit fault is caused by incoming dust upon dry-etching a wiring layer formed comparatively thick in order to decrease a resistance. Therefore, for example, as described in Japanese Unexamined Patent Application Publication No. H09-127555, a method with the use of wet etching has been disclosed as a processing technique of the wiring layer.

SUMMARY

The wiring layer is also used as a terminal section for connection with an external circuit such as a flexible printed circuit, and is connected to the external circuit through a mounted member. However, since the wiring layer is exposed as the uppermost surface of the terminal section until the mounted member is laminated, there has been a disadvantage that the wiring layer is damaged in other wet etching step such as a step of processing a pixel electrode of a display element, leading to variations in display performance.

It is desirable to provide a display unit, a method of manufacturing the same, and an electronic apparatus that are capable of suppressing variations in display performance.

According to an embodiment of the present application, there is provided a display unit including: a display layer including a pixel electrode; a semiconductor layer provided in a layer below the display layer, the semiconductor layer including a wiring layer that includes a material removable by an etchant by which the pixel electrode is also removable; and a terminal section configured to electrically connect the semiconductor layer to an external circuit, the terminal section including a first electrically-conductive layer made of a material same as a material of the wiring layer.

According to an embodiment of the present application, there is provided a method of manufacturing a display unit, the method including: (A) forming a wiring layer in a semiconductor layer on a substrate, and forming a first electrically-conductive layer in a terminal section, the first electrically-conductive layer being made of a material same as a material of the wiring layer; (B) forming, as a continuous film, a pixel electrode on the semiconductor layer and the first electrically-conducive layer, the pixel electrode configuring a display layer, and the pixel electrode being made of a material removable by an etchant by which the wiring layer is also removable; and (C) removing part or all of the pixel electrode on the first electrically-conducive layer to from the terminal section.

According to an embodiment of the present application, there is provided an electronic apparatus with a display unit, the display unit including: a display layer including a pixel electrode; a semiconductor layer provided in a layer below the display layer, the semiconductor layer including a wiring layer that includes a material removable by an etchant by which the pixel electrode is also removable; and a terminal section configured to electrically connect the semiconductor layer to an external circuit, the terminal section including a first electrically-conductive layer made of a material same as a material of the wiring layer.

In the display unit, the method of manufacturing the same, and the electronic apparatus according to the above-described embodiments of the present application, the wiring layer and the pixel electrode are formed of the materials that are removable by the same etchant. The terminal section includes the first electrically-conductive layer formed at least in the same step as a step in which the wiring layer is formed. In the step of forming the terminal section, the metal film to become the pixel electrode is formed on the first electrically-conductive layer, and subsequently, part or all of the metal film on the first electrically-conductive layer is removed. Thereby, damage due to etching of the electrically-conductive layer configuring the terminal section is reduced.

According to the display unit, the method of manufacturing the same, and the electronic apparatus according to the above-described embodiments of the present application, the electrically-conductive layer (the first electrically-conductive layer) configuring the terminal section is formed in the same step as of the step in which the wiring layer is formed, the metal film to become the pixel electrode of the display layer is formed on the electrically-conductive layer, and subsequently, part or all of the metal film is removed. Thereby, damage due to etching of the terminal section is reduced, and variations in display performance are suppressed. Therefore, a highly-reliable electronic apparatus is provided.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 16A is a perspective view illustrating an appearance viewed from the front side of Application example 1 of a display unit using a pixel according to the foregoing embodiments and the like.

FIG. 16B is a perspective view illustrating an appearance viewed from the rear side of Application example 1 of the display unit using the pixel according to the foregoing embodiments and the like.

DETAILED DESCRIPTION

Some embodiments of the present disclosure will be described in detail below with reference to the drawings. The description will be given in the following order.
1. Whole Configuration of Display Unit
2. First Embodiment (an example in which a terminal section is configured of a wiring layer, and a protective film is formed on an end portion thereof)
2-1. Configuration of Terminal Section
2-2. Manufacturing Method
2-3. Function and Effect 3. Second Embodiment (an example in which a terminal section has a laminated structure configured of a wiring layer and a pixel electrode)
4. Modification 1 (an example in which a multilayer wiring is included)
5. Modification 2 (another example in which a multilayer wiring is included)
6. Modification 3 (an example in which a wiring layer has a laminated structure made of materials having different etching characteristics)
7. Application Examples (examples of display units each including a circuit substrate, and electronic apparatuses)

1. WHOLE CONFIGURATION OF DISPLAY UNIT

Figure 1:
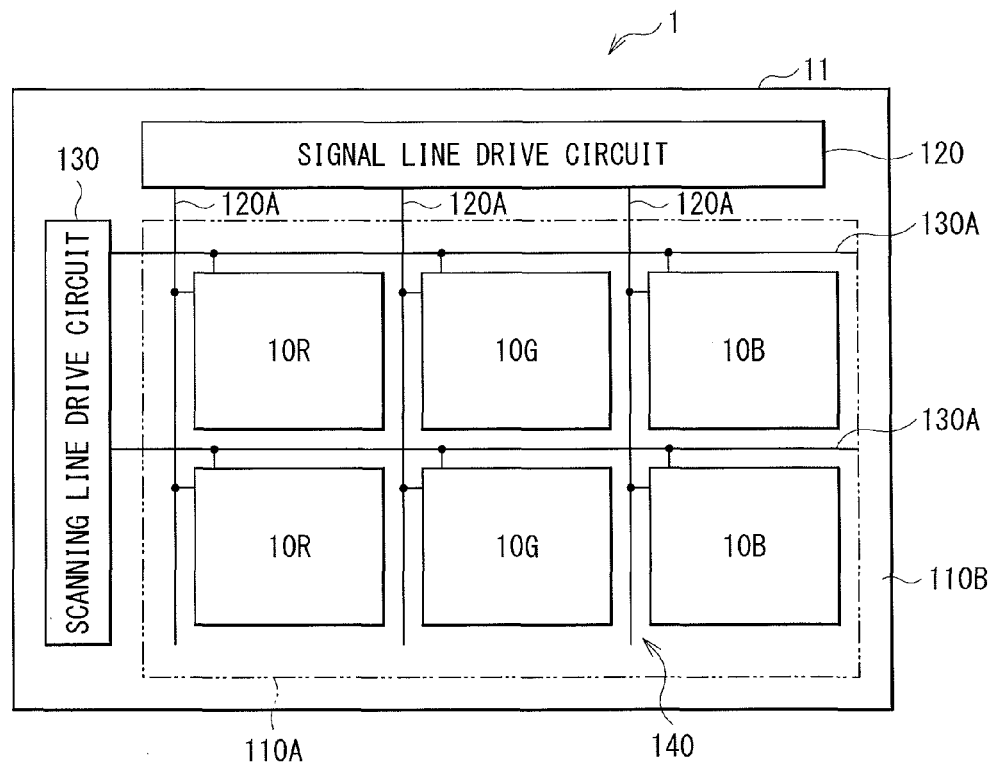
FIG. 1 is a diagram illustrating a configuration of a display unit.

FIG. 1 illustrates an example of a planar configuration of a display unit (display unit 1) according to an embodiment of the present disclosure. The display unit 1 may be used, for example, for an inspection monitor or the like, and may have a configuration in which a plurality of pixels (red pixels 10R, green pixels 10G, and blue pixels 10B) are arranged, for example, in a state of matrix in a display region 110A. A pixel section 10 (see FIG. 3B) may have, for example, red light emitting elements 30R (the red pixels 10R) emitting red monochromatic light, green light emitting elements 30G (the green pixels 10G) emitting green monochromatic light, and blue light emitting elements 30B (the blue pixels 10B) emitting blue monochromatic light (for any component, see FIG. 3A). The light emitting elements 30R, 30G, and 30B may be configured of, for example, after-mentioned organic EL elements. Alternatively, the light emitting elements 30R, 30G, and 30B may be configured of inorganic EL elements, semiconductor lasers, LEDs (Light Emitting Diodes), or the like. Around the display region 110A (in a peripheral region 110B), a signal line drive circuit 120 and a scanning line drive circuit 130 that are drivers for displaying an image are provided.

Figure 2:
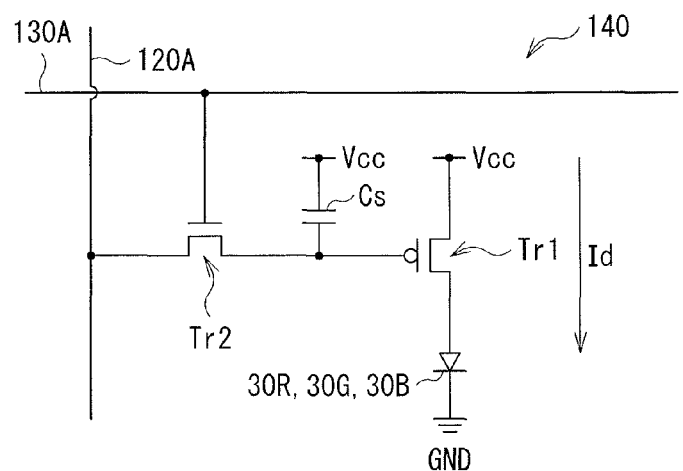
FIG. 2 is a diagram illustrating an example of a pixel drive circuit illustrated in FIG. 1.

In the display region 110A, a pixel drive circuit 140 is provided. FIG. 2 illustrates an example of the pixel drive circuit 140. The pixel drive circuit 140 is an active-type drive circuit formed in a layer below an after-mentioned pixel electrode 31. That is, the pixel drive circuit 140 has a drive transistor Tr1, a writing transistor Tr2, a capacitor (retentive capacity) Cs between the transistors Tr1 and Tr2, and the light emitting element 30R (or one of 30G and 30B) serially connected to the drive transistor Tr1 between a first power line (Vcc) and a second power line (GND). Each of the drive transistor Tr1 and the writing transistor Tr2 is configured of a general thin film transistor. The configuration thereof is not particularly limited, and may be, for example, an inverse-stagger structure (a so-called bottom-gate type, that is, a structure in which a gate electrode, a channel layer, and a pair of source-drain electrodes are layered in order), or a stagger structure (a top-gate type, that is, a structure in which a channel layer, a gate electrode, and a pair of source-drain electrodes are layered in order).

In the pixel drive circuit 140, a plurality of signal lines 120A are arranged in a column direction, and a plurality of scanning lines 130A are arranged in a row direction. Every intersection of each signal line 120A and each scanning line 130A corresponds to one of the light emitting elements 30R, 30G, and 30B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and scanning signals are sequentially supplied from the scanning line drive circuit 130 to a gate electrode of the writing transistor Tr2 through the scanning line 130A.

Figure 3A:
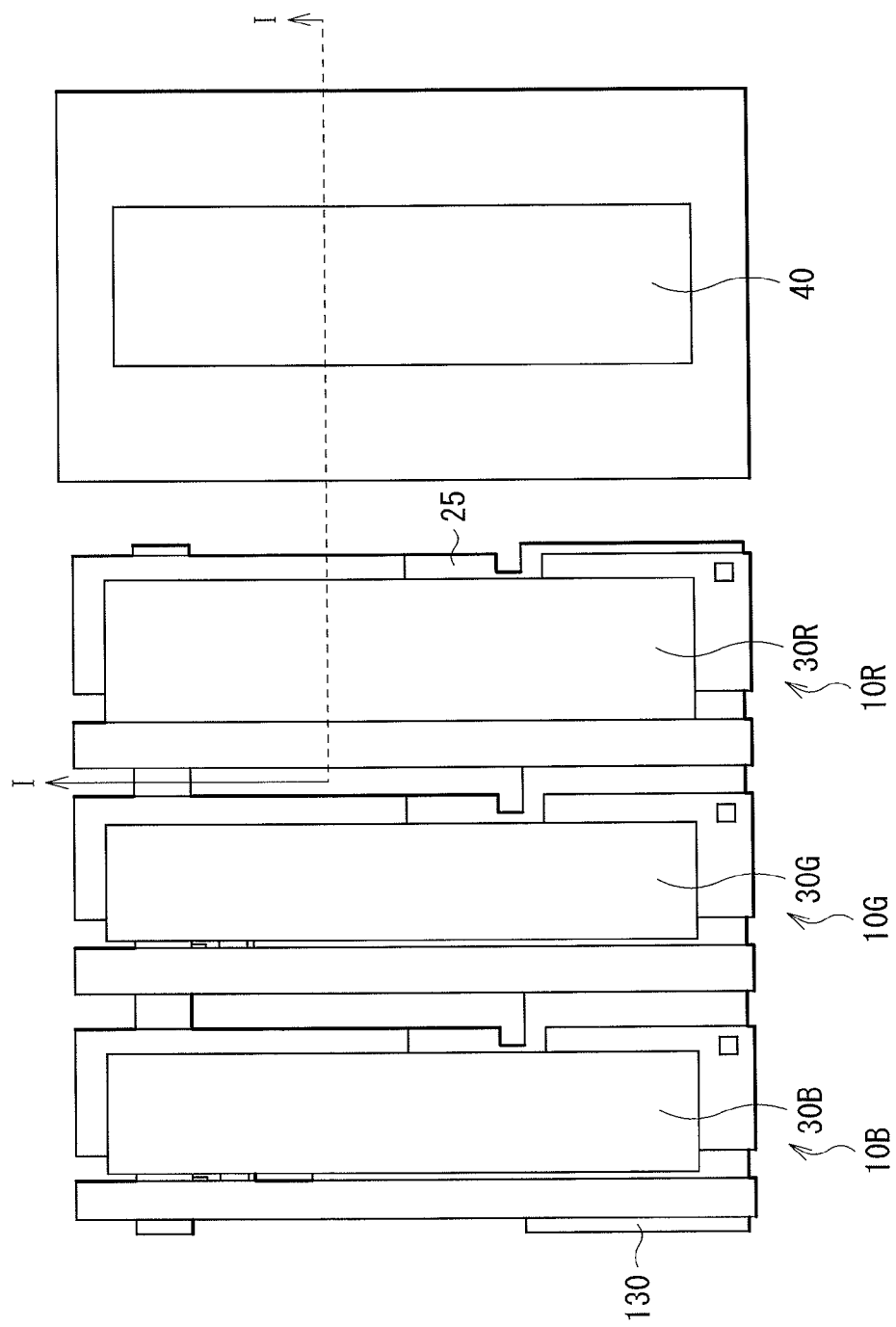
FIG. 3A is a plan view illustrating a configuration of a display unit according to a first embodiment of a present disclosure.
Figure 3B:
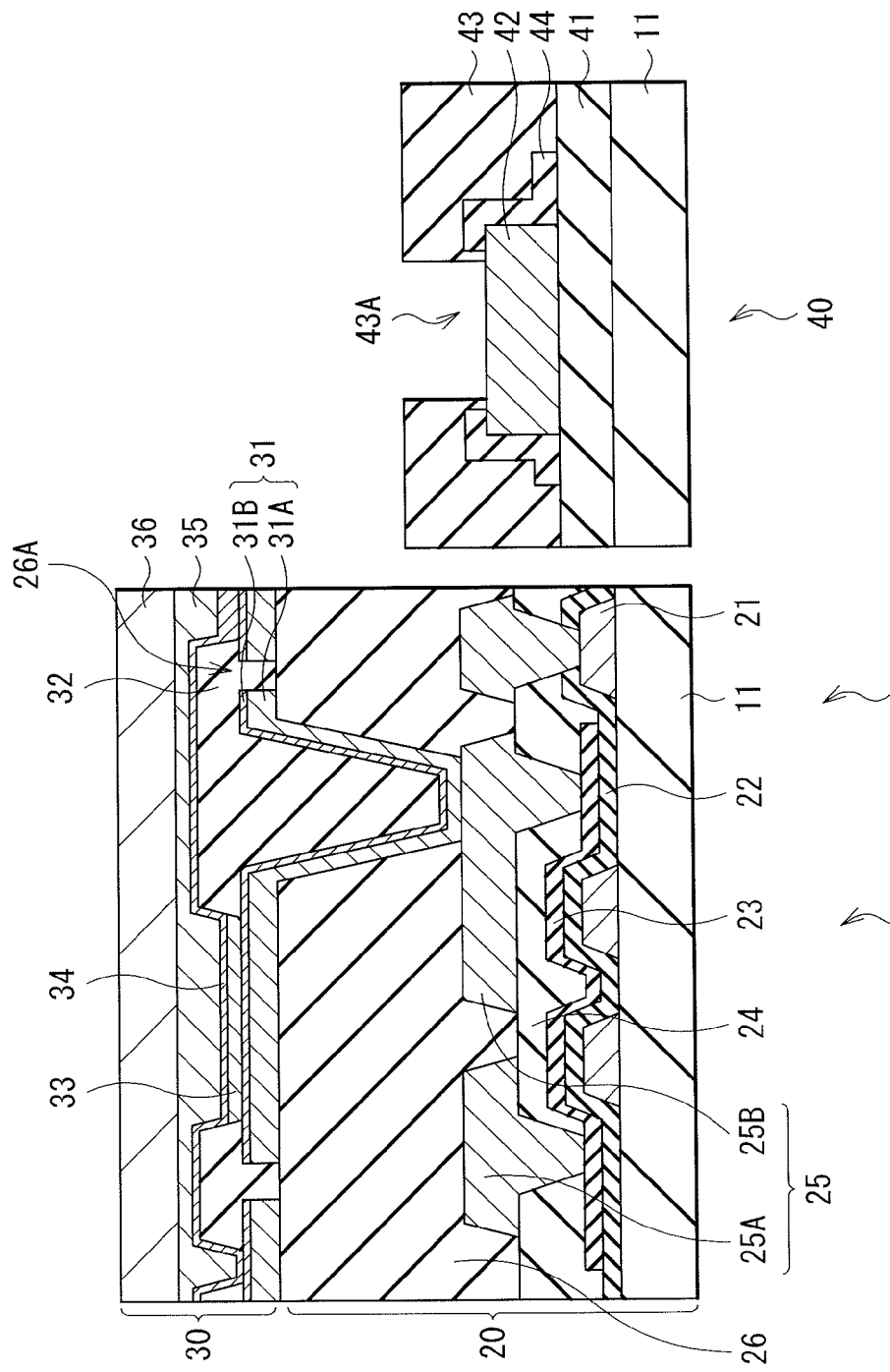
FIG. 3B is a cross-sectional view of the display unit illustrated in FIG. 3A.

FIG. 3A illustrates planar configurations of the pixel section 10 and a terminal section 40 in an after-mentioned first embodiment. FIG. 3B illustrates cross-sectional configurations taken along a dashed-line I-I of one pixel (such as the red pixel 10R) configuring the pixel section 10 and the terminal section 40 illustrated in FIG. 3A. The semiconductor layer 20 may be provided, for example, with the foregoing drive transistor Tr1, the foregoing writing transistor Tr2, and the like. A display layer 30 is provided on a semiconductor layer 20, and has the foregoing light emitting elements 30R, 30G, and 30B.

In the display unit 1 according to this embodiment of the present disclosure, the terminal section 40 may be configured of an electrically-conductive layer 42 (first electrically-conductive layer) formed in the same step as a step of forming a wiring layer configuring, for example, the drive transistor Tr1, specifically, a step of forming a gate electrode 21 or a pair of source-drain electrodes 25 (a source electrode 25A and a drain electrode 25B). The terminal section 40 is a connection section between a lead wiring in the display unit 1 and an external circuit (such as a flexible printed circuit).

A description will be given below of the semiconductor layer 20 and the display layer 30 that configure the pixel section 10, and the terminal section 40.

Configuration of Semiconductor Layer

In the semiconductor layer 20 on the substrate 11, the foregoing drive transistor Tr1 and the foregoing writing transistor Tr2 are formed. On the transistors Tr1 and Tr2, a planarizing insulating film 26 is provided. Although the transistors Tr1 and Tr2 (referred to as a thin film transistor 20A below) may be of a top-gate type or a bottom-gate type, in this embodiment, description will be given by taking the bottom-gate type thin film transistor 20A as an example. In the thin film transistor 20A, the gate electrode 21, a gate insulating film 22, an organic semiconductor film (a channel layer 23) forming a channel region, an interlayer insulating film 24, and the pair of source-drain electrodes (the source electrode 25A and the drain electrode 25B) are provided in order from the substrate 11.

For the substrate 11, for example, a plastic substrate made, for example, of polyether sulfone, polycarbonate, polyimides, polyamides, polyacetals, polyethylene terephthalate, polyethylene naphthalate, polyetherether ketone, polyolefins, or the like; a metal foil substrate made, for example, of aluminum (Al), nickel (Ni), copper (Cu), stainless steel, or the like with a surface subjected to insulation treatment; paper; or the like may be used other than a glass substrate. Further, a functional film such as a buffer layer to improve adhesibility and flatness and a barrier film to improve gas-barrier characteristics may be formed on the substrate. Further, if the channel layer 23 is allowed to be formed without heating the substrate 11, for example, by a sputtering method or the like, an inexpensive plastic film may be used for the substrate 11.

The gate electrode 21 has a role to apply a gate voltage to the thin film transistor 20A and to control carrier density in the channel layer 23 by the gate voltage. The gate electrode 21 is provided in a selective region on the substrate 11, and may be made, for example, of a simple substance of metal such as platinum (Pt), titanium (Ti), ruthenium (Ru), molybdenum (Mo), Cu, tungsten (W), nickel (Ni), Al, and tantalum (Ta), or an alloy thereof. Further, the gate electrode 21 may have a structure in which two or more thereof are layered.

The gate insulating film 22 is provided between the gate electrode 21 and the channel layer 23, and may have a thickness, for example, from 50 nm to 1 μm both inclusive. The gate insulating film 22 may be formed, for example, of an insulating film including one or more of a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. The gate insulating film 22 may have a single-layer structure, or a laminated structure using two or more materials such as SiN and SiO. In the case where the gate insulating film 22 has the laminated structure, interface characteristics with respect to the channel layer 23 are improved, and mixing of impurity (such as moisture) from ambient air into the channel layer 23 is effectively suppressed. The gate insulating film 22 is patterned in a predetermined shape by etching after coating. Alternatively, depending on the material, pattern formation of the gate insulating film 22 may be performed by a printing technology such as ink-jet printing, screen printing, offset printing, and gravure printing.

The channel layer 23 is provided on the gate insulating film 22 in a shape of an island, and has a channel region in a position opposed to the gate electrode 21 between the source electrode 25A and the drain electrode 25B. The channel layer 23 may have a thickness from 5 nm to 100 nm both inclusive, for example. The channel layer 23 may be made, for example, of an organic semiconductor material such as a peri-xanthenoxanthene (PXX) derivative. Examples of the organic semiconductor material may include polythiophene, poly-3-hexylthiophene [P3HT] obtained by introducing a hexyl group to polythiophene, pentacene [2,3,6,7-dibenzo anthracene], polyanthracene, naphthacene, hexacene, heptacene, dibenzo pentacene, tetrabenzo pentacene, chrysene, perylene, coronene, Terylene, ovalene, quaterrylene, circumanthracene, benzopyrene, dibenzopyrene, triphenylene, polypyrrole, polyaniline, polyacetylene, polydiacetylene, polyphenylene, polyfuran, polyindole, polyvinylcarbazole, polyselenophene, polytellurophene, polyisothianaphthene, polycarbazole, polyphenylene sulfide, polyphenylene vinylene, polyphenylene sulfide, polyvinylene sulfide, polythienylene vinylene, polynaphthalene, polypyrene, polyazulene, phthalocyanine represented by copper phthalocyanine, merocyanine, hemicyanine, polyethylene dioxythiophene, pyridazine, naphthalene tetracarboxylic acid diimide, poly(3,4-ethyleen dioxythiophene)/polystyrene sulfonic acid [PEDOT/PSS], 4,4'-biphenyl dithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine(biphenyl-4,4'-diamine), TCNQ (tetracyanoquinodimethane), a charge-transfer complex represented by a tetrathiafulvalene (TTF)-TCNQ complex, a bisethylene tetrathiafulvalene (BEDTTTF)-perchloric acid complex, a BEDTTTF-iodine complex, and a TCNQ-iodine complex, biphenyl-4,4'-dicarboxylic acid, 24-di(4-thiophenyl acetylenyl)-2-ethylbenzene, 24-di(4-isocyanophenyl acetylenyl)-2-ethylbenzene, dendrimer, fullerene such as C60, C70, C76, C78, and C84, 24-di(4-tiohphenylethynyl)-2-ethylbenzene, 2,2''-dihydroxy-1,1':4',1''-terphenyl, 4,4'-biphenyl diethanal, 4, 4'-biphenyldiol, 4, 4'-biphenyldiisocyanate, 24-diacetynylbenzene, diethylbiphenyl-4,4'-dicarboxylate, benzo[22-c;3,4-c';5,6-c"]tris [22]dichiol-24, 7-trithion, alpha-sexithiophene, tetrathiotetracene, tetraselenotetracene, tetratellurtetracene, poly(3-alkylthiophene), poly(3-thiophene-β-ethanesulfonic acid), poly(N-alkylpyrrole)poly(3-alkylpyrrole), poly(3,4-dialkylpyrrole), poly(2,2'-thienylpyrrole), poly(dibenzothiophene sulfide), and quinacridone. In addition thereto, a compound selected from a group consisting of condensed polycyclic aromatic compounds, porphyrin-based derivatives, phenylvinylidene-based conjugate-system oligomers, and thiophene-based conjugate-system oligomers may be used. Further, a mixture of an organic semiconductor material and an insulating polymer material may be used.

The channel layer 23 may be formed by a vacuum evaporation method. However, the channel layer 23 may be preferably formed, for example, by a coating and printing process by dissolving any of the foregoing materials, for example, in an organic solvent and using the resultant as an ink solution. One reason for this is that the coating and printing process reduces cost more than the vacuum evaporation method, and is effective in improving throughput. Specific examples of the coating and printing process may include methods such as cast coating, spin coating, spray coating, inkjet printing, relief printing, flexo printing, screen printing, gravure printing, and gravure offset printing.

The source electrode 25A and the drain electrode 25B are provided on the channel layer 23 being separated from each other, and are electrically connected to the channel layer 23. As a material configuring the source electrode 25A and the drain electrode 25B, a metal material, a metalloid material, an inorganic semiconductor material, etc. may be used. Specific examples thereof may include the electrically-conductive film materials mentioned for the foregoing gate electrode 21; aluminum (Al), gold (Au), silver (Ag), indium tin oxide (ITO), and molybdenum oxide (MoO); and an alloy of any of these kinds of metal. The source electrode 25A and the drain electrode 25B are configured of simple substance of any of the foregoing metal or alloy thereof. The source electrode 25A and the drain electrode 25B may have a single layer structure, or may have a structure obtained by laminating two or more of the foregoing materials. Examples of the laminated structure may include a laminated structure such as [Ti/Al/Ti] and [Mo/Al].

The planarizing insulating film 26 planarizes the surface of the substrate 11 on which the thin film transistor 20A is formed. Examples of constituent materials of the planarizing insulating film 26 may include an organic material such as polyimide and an inorganic material such as silicon oxide ($SiO_2$).

Configuration of Display Layer

The display layer 30 includes the red light emitting element 30R (or one of the green light emitting element 30G and the blue light emitting element 30B), and is provided on the semiconductor layer 20, specifically, on the planarizing insulating film 26. The red light emitting element 30R is a light emitting element in which a pixel electrode 31 as an anode, an interelectrode insulating film 32 (dividing wall), an organic layer 33 including a light emitting layer, and a counter electrode 34 as a cathode are layered in order from the semiconductor layer 20. A sealing substrate 36 is bonded onto the counter electrode 34 with a sealing layer 35 in between. The thin film transistor 20A and the red light emitting element 30R are electrically connected to the pixel electrode 31 through a connection hole 26A provided in the planarizing insulating film 26.

The pixel electrode 31 also has a function as a reflection layer, and may desirably have high reflectance as much as possible in order to improve light emission efficiency. In particular, in the case where the pixel electrode 31 is used as an anode, the pixel electrode 31 may be desirably made, for example, of a material having high hole-injection characteristics. Examples of such a material of the pixel electrode 31 may include simple substance of a metal element such as aluminum (Al), chromium (Cr), gold (Au), platinum (Pt), nickel (Ni), copper (Cu), tungsten (W), and silver (Ag); and an alloy thereof. On the surface of the pixel electrode 31, a transparent electrode having a large work function may be preferably layered. In this embodiment of the present disclosure, description will be given below of a case, as an example, in which the pixel electrode 31 has a laminated structure configured of a layer (a reflective electrode film 31A) made of the above-described material having a reflective function such as Al and a layer (a transparent electrode film 31B) made of a transparent electrically-conductive material such as an oxide of indium and tin (ITO).

The interelectrode insulating layer 32 is configured to secure insulation between the pixel electrode 31 and the counter electrode 34, and to allow a light emission region to have a desirable shape. The interelectrode insulating layer 32 may be made, for example, of a photosensitive resin. The interelectrode insulating film 32 is provided only around the pixel electrode 31. A region, of the pixel electrode 31, exposed from the interelectrode insulating film 32 is the light emission region. It is to be noted that, although the organic layer 33 and the counter electrode 34 are also provided on the interelectrode insulating film 32, light is emitted only from the light emission region.

For example, the organic layer 33 may have a configuration in which a hole injection layer, a hole transport layer, a light emission layer, an electron transport layer, and an electron injection layer are laminated in order from the pixel electrode 31. These layers may be provided as necessary. Configurations of the respective layers forming the organic layer 33 may differ according to emission colors of the light emitting elements 30R, 30G, and 30B. The hole injection layer improves hole injection efficiency, and is a buffer layer to prevent leakage. The hole transport layer improves transport efficiency of holes to the light emission layer. In the light emission layer, when an electric field is applied, recombination of electrons and holes occurs, and thereby, light is generated. The electron transport layer improves transport efficiency of electrons to the light emission layer. The electron injection layer improves electron injection efficiency.

The counter electrode 34 is made, for example, of an alloy of aluminum (Al), magnesium (Mg), calcium (Ca), or sodium (Na). In particular, an alloy (Mg—Ag alloy) of magnesium and silver may be preferable, since such an alloy has both electric conductivity and small absorption in a thin film. Although the ratio between magnesium and silver in the Mg—Ag alloy is not limited, the film thickness ratio between Mg and Ag may be desirably in a range from 20:1 to 1:1 both inclusive. Further, as a material of the counter electrode 34, an alloy (Al—Li alloy) of aluminum (Al) and lithium (Li) may be used.

The sealing layer 35 may have, for example, a laminated structure configured of a layer made of silicon nitride ($SiN_x$), silicon oxide ($SiO_x$), a metal oxide, or the like, and a layer made of a thermosetting resin, an ultraviolet curable resin, or the like. For example, the sealing substrate 36 provided with a light-blocking film and a color filter may be bonded onto the sealing layer 35.

Configuration of Terminal Section

As described above, the terminal section 40 connects various wirings in the display unit 1 to an external circuit. In this embodiment, the terminal section 40 may be configured of the electrically-conductive layer 42 (the first electrically-conductive layer) formed in the same step as of the step of forming the wiring layer provided in the semiconductor layer 20 such as the gate electrode 21 or the source electrode 25A and the drain electrode 25B. In other words, in this embodiment, the terminal section 40 may be configured of the electrically-conductive layer 42 (the first electrically-conductive layer) formed of the same material as the material of the wiring layer provided in the semiconductor layer 20 such as the gate electrode 21 or the source electrode 25A and the drain electrode 25B. Alternatively, the terminal section 40 may have a configuration in which an electrically-conductive layer (a second electrically-conductive layer) formed in the same step as a step of forming the pixel electrode 31 is laminated on the electrically-conductive layer 42.

It is to be noted that, in the display unit 1 according to this embodiment of the present disclosure, a material included in the wiring layer (the gate electrode 21 or one of the source electrode 25A and the drain electrode 25B) formed in the same step as of the step of forming the electrically-conductive layer 42 in the terminal section 40 and a material included in the pixel electrode 31 in the display layer 30 are removable by the same etchant (these materials have the same etching characteristics). Examples of etchant types may include acetic-acid-phosphoric-acid-nitric-acid-based aqueous solution, hydrofluoric-acid-nitric-acid-based aqueous solution, and ammonia-hydrogen-peroxide-based aqueous solution. For example, aluminum (Al), silver (Ag), or molybdenum (Mo) may be removed by the acetic-acid-phosphoric-acid-nitric-acid-based aqueous solution. For example, tantalum (Ta) or tungsten (W) may be removed by the hydrofluoric-acid-nitric-acid-based aqueous solution. For example, titanium (Ti), titanium nitride (TiN), or copper (Cu) may be removed by the ammonia-hydrogen-peroxide-based aqueous solution.

2. FIRST EMBODIMENT 2-1. Configuration of Terminal Section

The display unit 1 in the first embodiment of the present disclosure has a configuration in which, as illustrated in FIG. 3B, the terminal section 40 is configured of the electrically-conductive layer 42 formed in the same step as of the step of forming the wiring layer provided in the semiconductor layer 20, that is, in this example, the source electrode 25A and the drain electrode 25B. In this embodiment, in the terminal section 40, an insulating film 41, the electrically-conductive layer 42, and an insulating film 43 having an opening 43A are laminated in order from the substrate 11. The end portion of the electrically-conductive layer 42, specifically, a portion from a circumferential edge portion of the top surface to side surfaces of the electrically-conductive layer 42 is covered with a protective film 44.

The terminal section 40 in the display unit 1 in this embodiment may be manufactured as follows.

2-2. Manufacturing Method

Figure 4A:
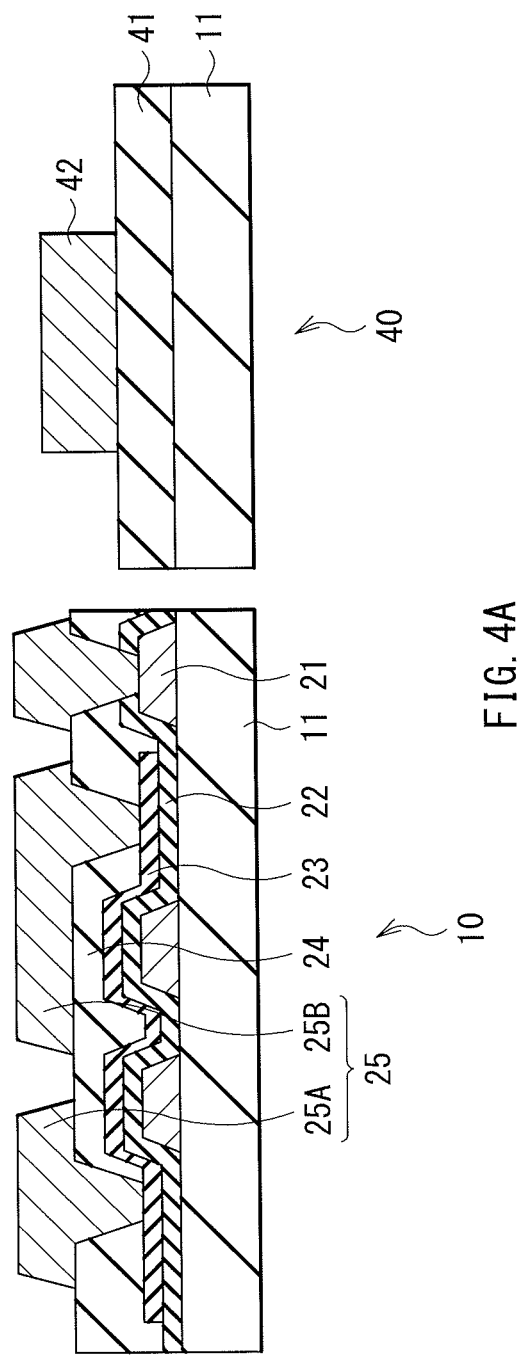
FIG. 4A is a cross-sectional view illustrating a method of manufacturing the display unit illustrated in FIGS. 3A and 3B in order of steps.

As illustrated in FIG. 4A, the semiconductor layer 20 and the terminal section 40 are formed on the substrate 11 by a general method. First, a metal film to become the gate electrode 21 may be formed on the whole surface of the substrate 11, for example, by a sputtering method, a vacuum evaporation method, or the like. Next, the metal film may be patterned, for example, by photolithography and etching, and thereby, the gate electrode 21 is formed. Subsequently, the gate insulating film 22, the insulating film 41, and the channel layer 23 are formed in order on the whole surfaces of the substrate 11 and the gate electrode 21. Specifically, the whole surface of the substrate 11 may be coated with the foregoing material of the gate insulating film such as PVP (polyvinylpyrrolidone) solution, for example, by spin coating, and the resultant is dried. Thereby, the gate insulating film 22 in the pixel section 10 and the insulating film 41 in the terminal section 40 are formed. Next, an organic semiconductor material such as PXX compound solution is applied onto this gate insulating film 22. Thereafter, the applied organic semiconductor material is heated, and thereby, the channel layer 23 is formed on the gate insulating film 22.

Subsequently, the interlayer insulating film 24 is formed on the channel layer 23. Thereafter, a metal film is formed on the channel layer 23, the interlayer insulating film 24, and the insulating film 41. Specifically, for example, a laminated film having a configuration of [Mo/Al/Mo] may be formed, for example, by a sputtering method. Next, the source electrode 25A, the drain electrode 25B, and the electrically-conductive layer 42 may be formed by etching with the use, for example, of a photolithography method.

Figure 4B:
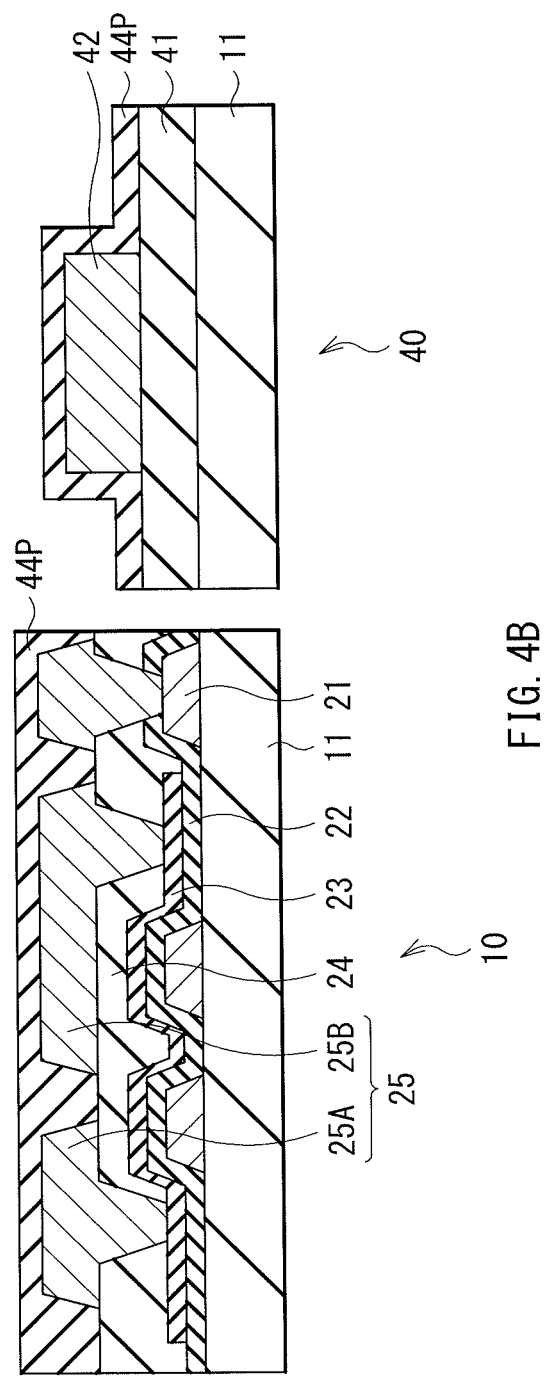
FIG. 4B is a cross-sectional view illustrating a step following a step of FIG. 4A.
Figure 4C:
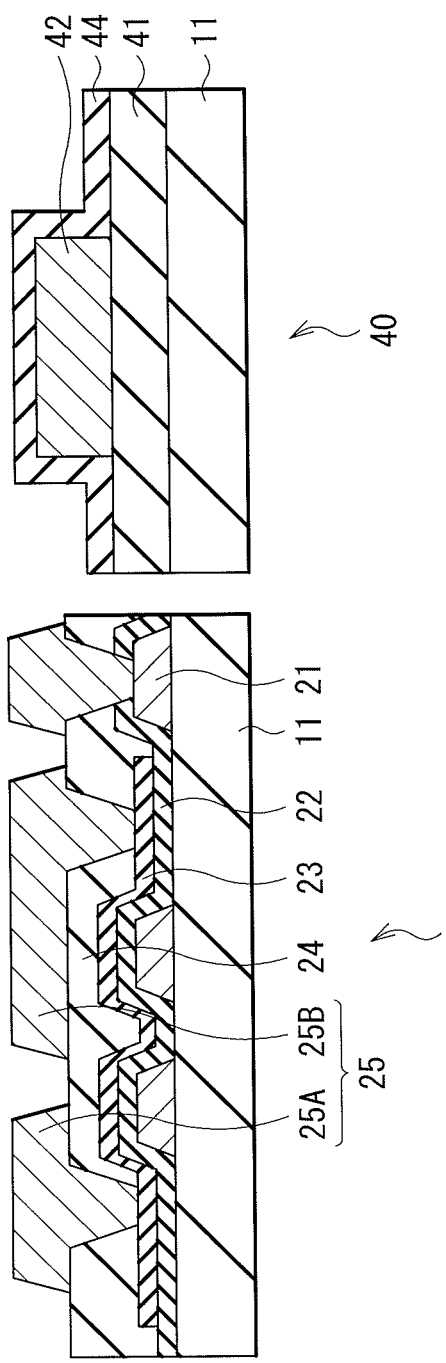
FIG. 4C is a cross-sectional view illustrating a step following the step of FIG. 4B.
Figure 4D:
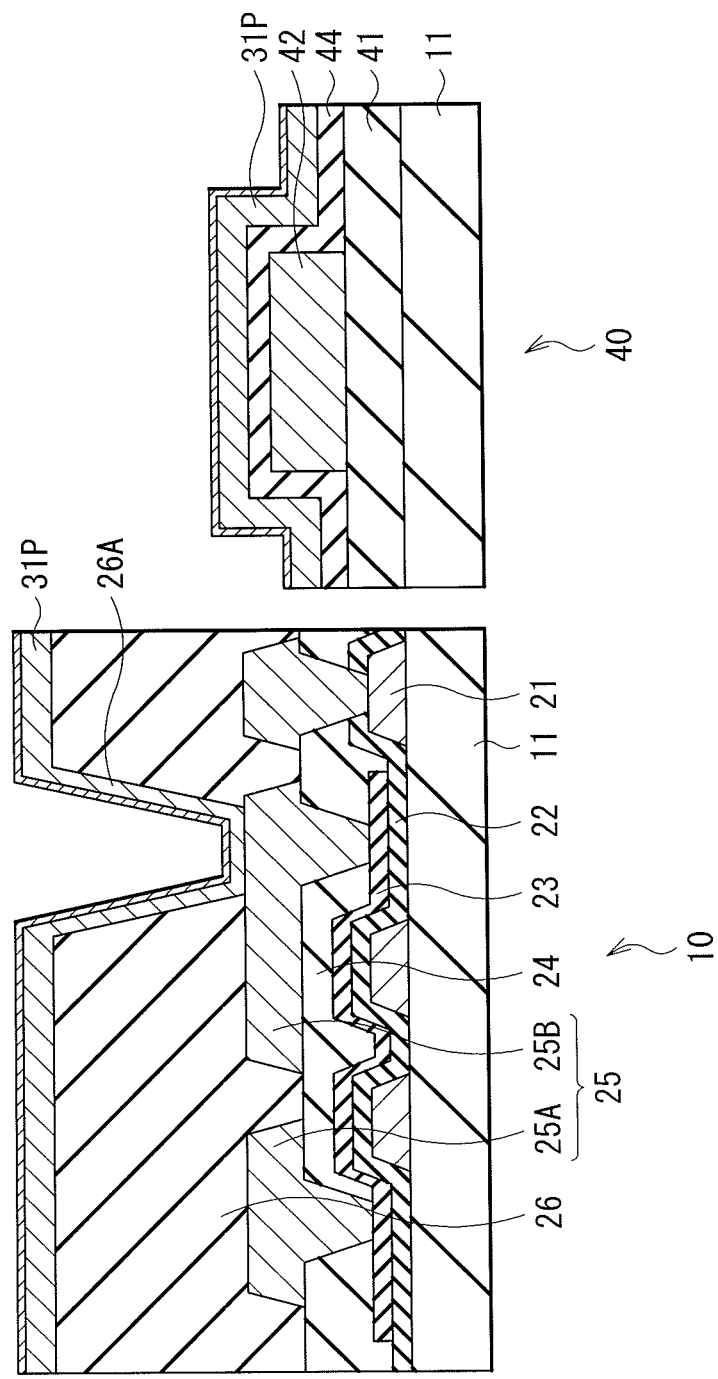
FIG. 4D is a cross-sectional view illustrating a step following the step of FIG. 4C.

Next, as illustrated in FIG. 4B, for example, SiN may be formed as a continuous film 44P on the interlayer insulating film 24, the source electrode 25A, the drain electrode 25B, and the electrically-conductive layer 42 by a sputtering method. Thereafter, as illustrated in FIG. 4C, the protective film 44 is formed by removing a portion of the continuous film 44P formed on the pixel section 10 by dry etching. Subsequently, as illustrated in FIG. 4D, a photosensitive resin such as polyimide is applied onto the pixel section 10, the planarizing insulating film 26 is formed and patterned into a predetermined shape by exposure and development, the connection hole 26A is formed, and the resultant is fired. Next, a metal film 31P having, for example, a configuration of [Al/ITO] may be formed on the planarizing insulating film 26 and the protective film 44 in the terminal section 40, for example, by a sputtering method.

Figure 5A:
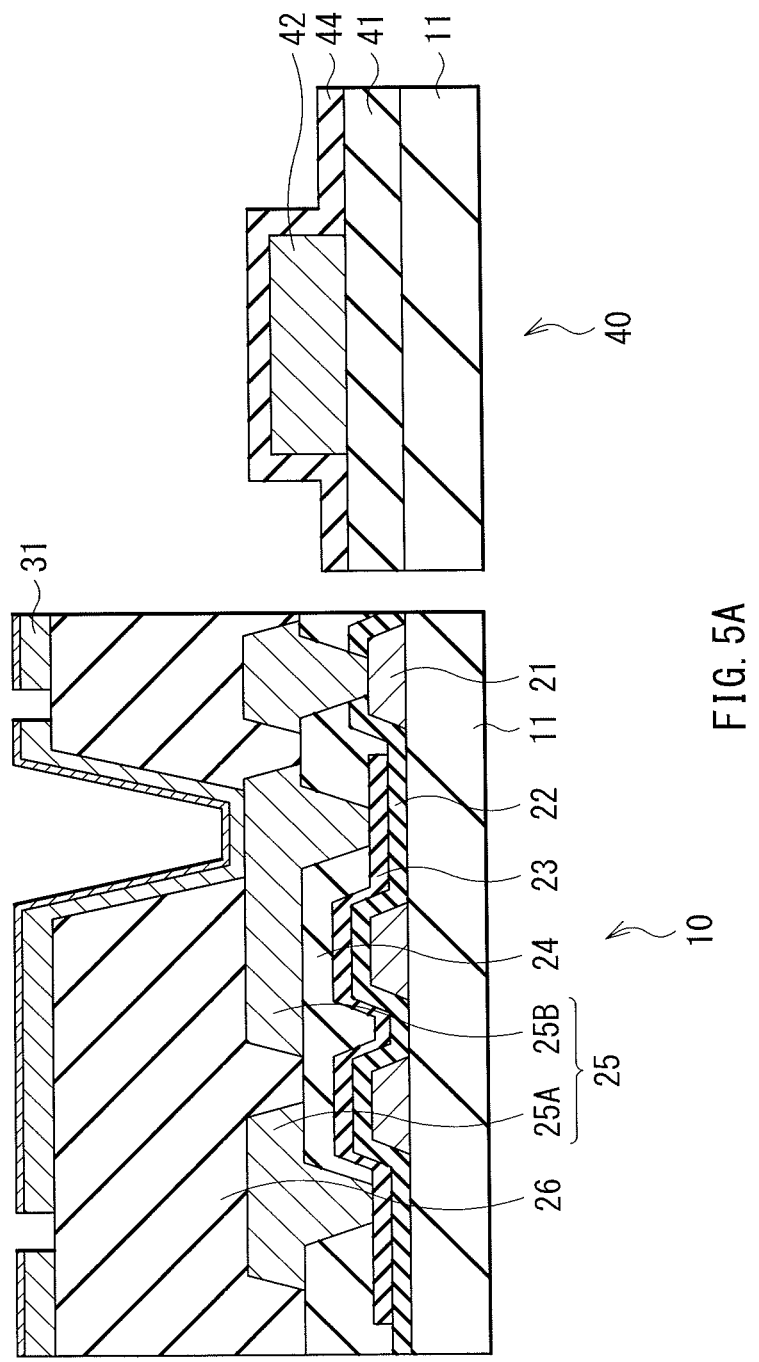
FIG. 5A is a cross-sectional view illustrating a step following the step of FIG. 4D.
Figure 5B:
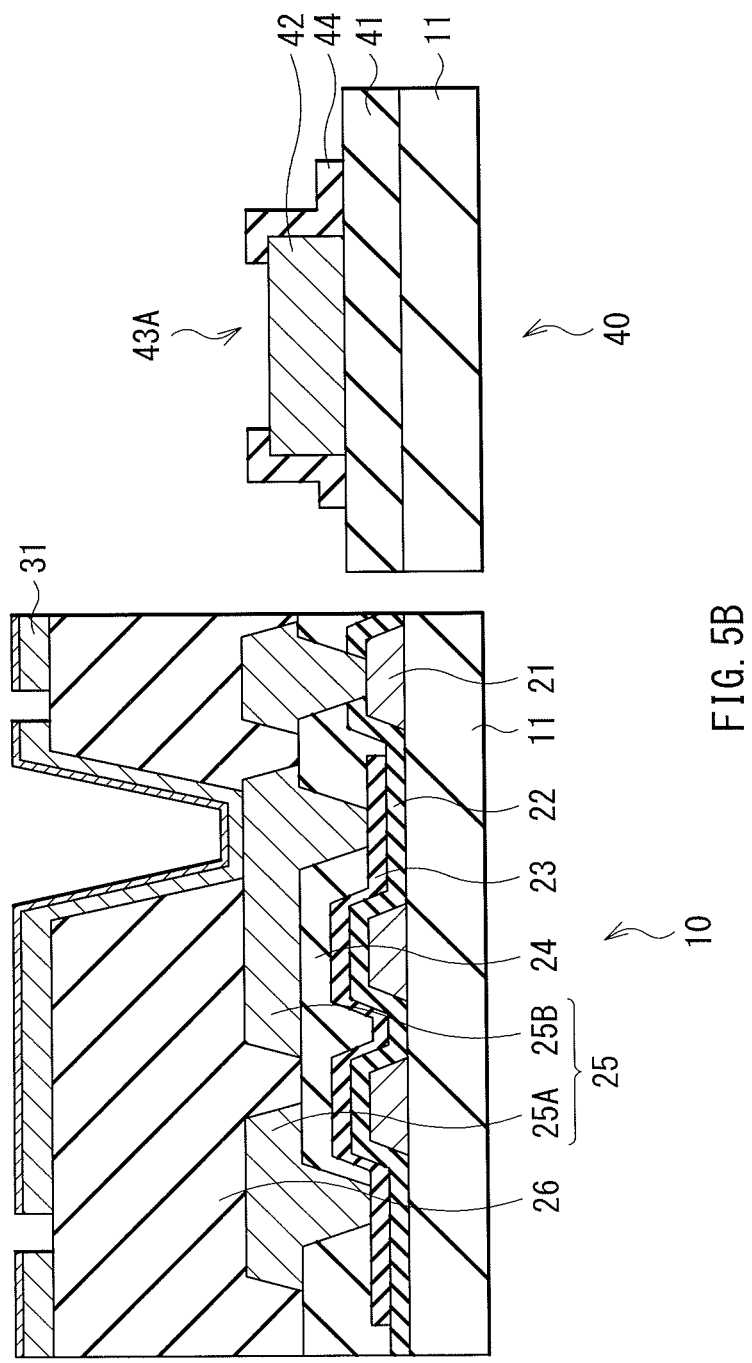
FIG. 5B is a cross-sectional view illustrating a step following the step of FIG. 5A.
Figure 5C:
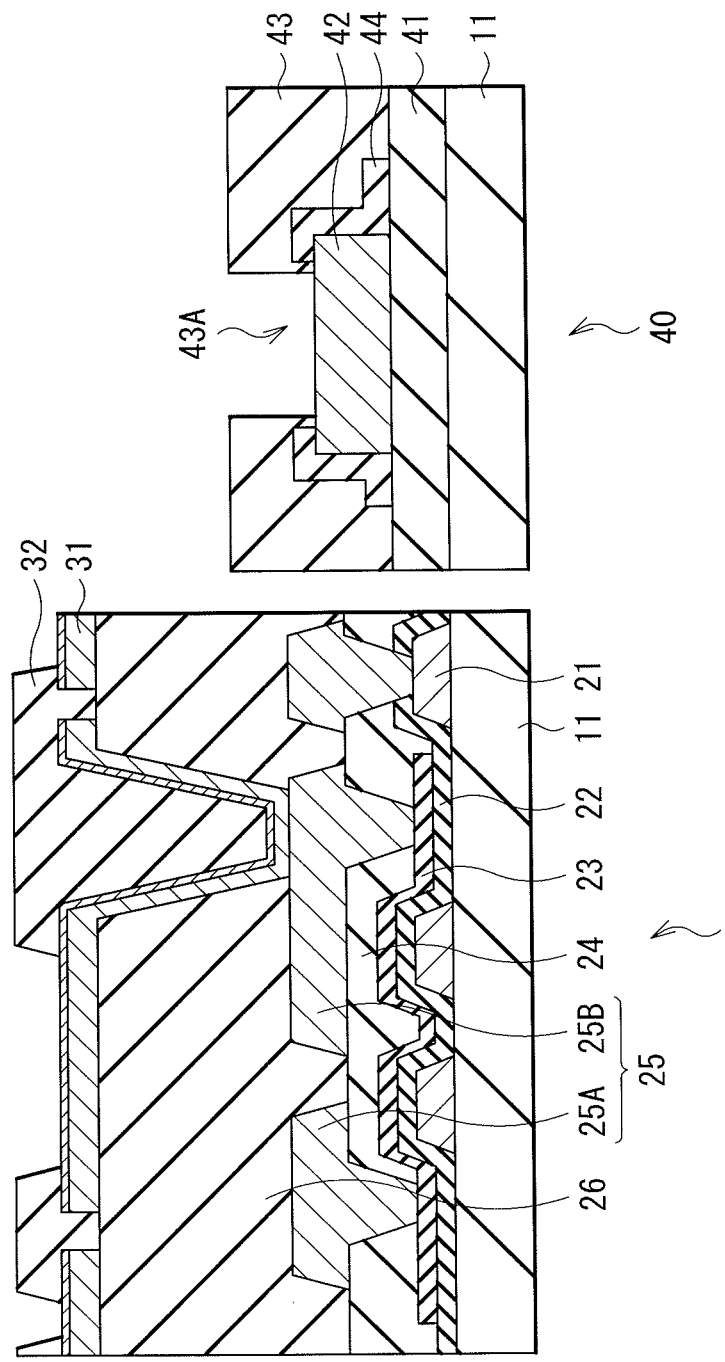
FIG. 5C is a cross-sectional view illustrating a step following the step of FIG. 5B.

Subsequently, as illustrated in FIG. 5A, portions of the metal film 31P on the whole surface of the terminal section 40 and part of the pixel section 10 are selectively removed by wet etching to form the pixel electrode 31 that is separated from each of the light emitting elements 30R, 30G, and 30B. Next, as illustrated in FIG. 5B, the protective film 42 in the terminal section 40 may be removed by dry etching with the use, for example, of SF6 to form the opening 43A to become a connection section with respect to the external circuit. Subsequently, as illustrated in FIG. 5C, an insulating film is formed on the whole surfaces of the pixel section 10 and the terminal section 40, and subsequently, the insulating film is processed to form the window-like interelectrode insulating film 32 defining the light emission region and the insulating film 43. Thereafter, the organic layer 33 including the light emission layer, and the counter electrode 34 are formed in the pixel section 10, for example, by an evaporation method. Thereafter, the sealing substrate 36 is bonded thereto with the sealing layer 35 in between. Finally, an FPC for connecting with the external circuit is mounted on the terminal section 40, and thereby, the display unit 1 is completed.

Such a display unit 1 is applicable to a display unit of an electronic apparatus in any field for displaying an image signal inputted from outside or an image signal generated inside as an image or a video such as a television, a digital camera, a notebook personal computer, a portable terminal device such as a mobile phone, and a video camcorder in addition to an inspection monitor.

2-3. Function and Effect

In general, as wiring materials of a gate electrode, source and drain electrodes, or the like of the drive transistor Tr1 (or the writing transistor Tr2) configuring a display unit, metal containing Al as a main component may be preferably used in terms of volume resistivity and processability of the wiring materials. Further, by using a metal material having high reflectance such as Al and Ag as a material of a pixel electrode in a light emitting element in a top-emission type organic EL display unit, high light emission efficiency is obtained. However, in a case where the foregoing wiring layer and the pixel electrode are made of the same material or materials dissolvable in the same etchant, and a terminal section connecting various wirings to an external circuit is made of the same material as that of the wiring layer configuring a pixel section, the surface of an electrically-conductive layer forming the terminal section is damaged or etched in a step of processing the wiring layer. Therefore, the terminal section has not been allowed to be normally formed, and mounting faults, an increase in resistance value of the terminal section, and the like have occurred. Accordingly, there have been disadvantages such as decrease in manufacturing yield, and decrease in reliability due to performance variations.

In contrast, in this embodiment, the metal film formed in the same step as of the step of forming the wiring layer (in this case, the source electrode 25A and the drain electrode 25B) forming the semiconductor layer 20 is formed as the electrically-conductive layer 42 in the terminal section 40, and thereafter, the protective film 44 is formed on the electrically-conductive layer 42. The protective film 44 is formed using the material that is not removable by the etchant used for etching the electrically conductive layer 42. Thereby, in the step of processing the pixel electrode 31 formed of the material that is removable by the same etchant as that of the source electrode 25A, the drain electrode 25B, and the electrically-conductive layer 42, that is, the material having the same etching characteristics as those of the source electrode 25A, the drain electrode 25B, and the electrically-conductive layer 42, damage of the electrically-conductive layer 42 is prevented.

As described above, in the display unit 1 and the method of manufacturing the display unit 1 in this embodiment, the metal film that is formed in the same step and is made of the same material as those of the wiring layer formed in the semiconductor layer 20 is formed as the electrically-conductive layer 42 configuring the terminal section 40, and thereafter, the protective film 44 is formed on the electrically-conductive layer 42. Thereby, in the subsequent etching step, damage of the electrically-conductive layer 42 is prevented, and the normal terminal section 40 is formed. Therefore, variations in characteristics are decreased, and manufacturing yield is improved. That is, a highly-reliable display unit is provided.

Description will be given below of a second embodiment and Modifications 1 to 3. It is to be noted that, in the following description, for the same components as the components in the first embodiment, the same referential symbols are affixed thereto, and description thereof will be omitted as appropriate.

3. SECOND EMBODIMENT

Figure 6:
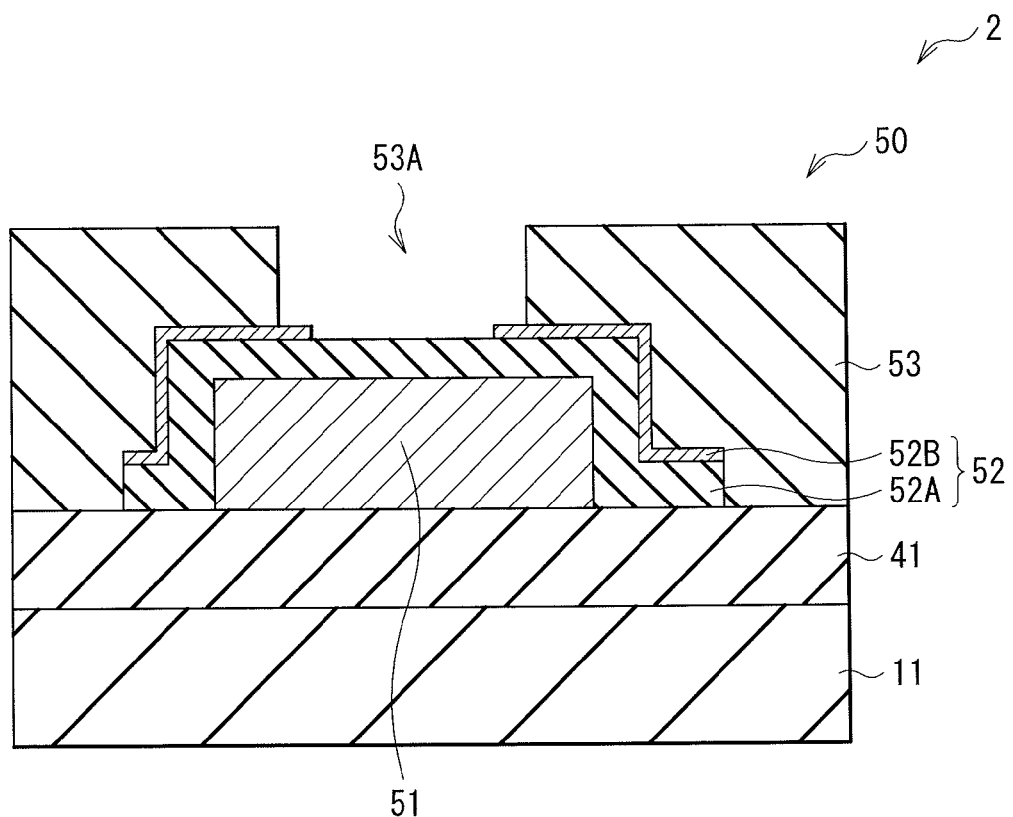
FIG. 6 is a cross-sectional view illustrating a configuration of a terminal section of a display unit according to a second embodiment of the present disclosure.

FIG. 6 illustrates a cross-sectional configuration of a terminal section 50 in a display unit 2 in the second embodiment of the present disclosure. The terminal section 50 is different from the foregoing first embodiment in that an electrically-conductive layer 52 formed in the same step as a step of forming the pixel electrode 31 is laminated on an electrically-conductive layer 51 formed in the same step as a step of forming the wiring layer formed in the semiconductor layer 20.

The terminal section 50 has the electrically-conductive layer 51 formed in the same step as the step of forming the wiring layer (in this example, the source electrode 25A and the drain electrode 25B) as in the first embodiment. On the electrically-conductive layer 51, the electrically-conductive layer 52 formed in the same step as of the step of forming the pixel electrode 31 is laminated. As in the first embodiment, the pixel electrode 31 in this embodiment has a laminated structure configured of a layer (the reflective electrode film 31A) made of a material (such as Al and an Al alloy) having the same etching characteristics as those of the wiring layer such as the source electrode 25A and the drain electrode 25B and a layer (the transparent electrode film 31B) formed with the use of a transparent electrically-conductive material such as ITO. Therefore, as with the pixel electrode 31, the electrically-conductive layer 52 in the terminal section 50 has a configuration in which a layer (an electrically-conductive layer 52A) made of a material having the same etching characteristics as those of the source electrode 25A and the drain electrode 25B, that is, a material having the same etching characteristics as those of the electrically-conductive layer 51, and a layer (a transparent electrode layer 52B) made of a transparent electrically-conductive material are laminated in this order. However, in the terminal section 50 in this embodiment, part of the transparent electrode material layer 52B on the surface thereof, specifically, a portion, in an opening section 53A, to become a connection surface with respect to an external circuit is removed, and the electrically-conductive layer 52A is exposed.

Figure 7A:
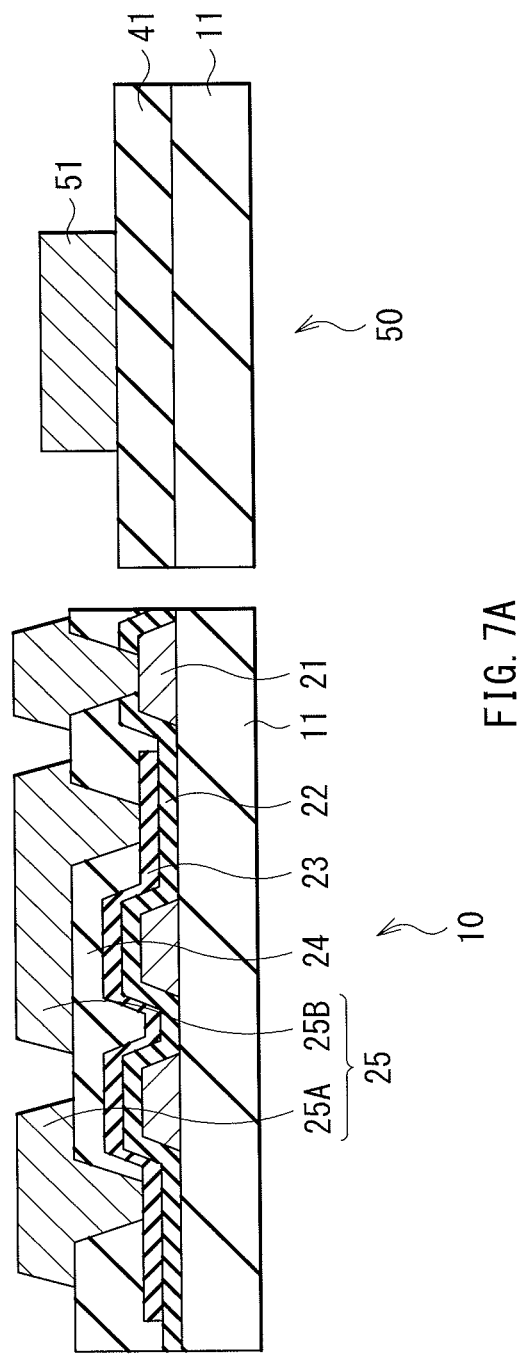
FIG. 7A is a cross-sectional view illustrating a method of manufacturing the display unit illustrated in FIG. 6 in order of steps.
Figure 7B:
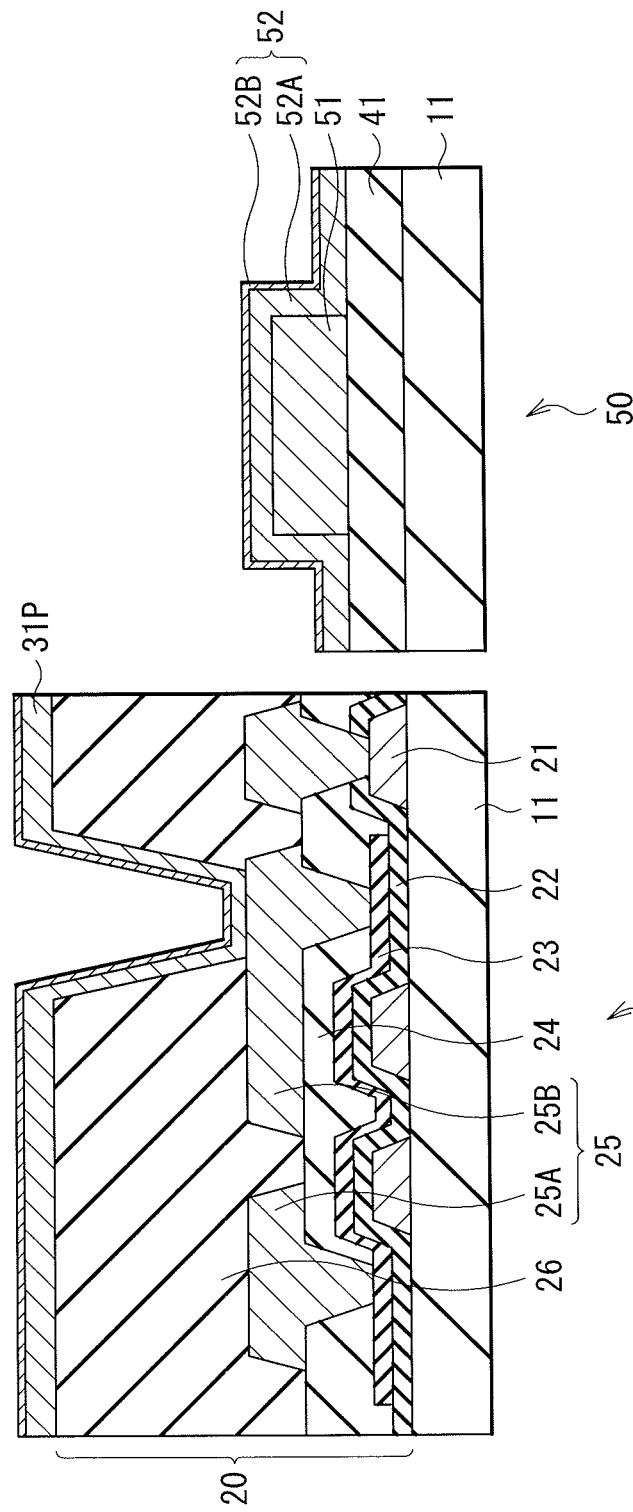
FIG. 7B is a cross-sectional view illustrating a step following a step of FIG. 7A.

The terminal section 50 in the display unit 2 in this embodiment may be manufactured as follows. First, by a method similar to that in the foregoing first embodiment, as illustrated in FIG. 7A, layers up to the source electrode 25A, the drain electrode 25B, and the electrically-conductive layer 51 are formed. Subsequently, as illustrated in FIG. 7B, after the planarizing insulating film 26 is formed, metal films 31P and 52 having, for example, a configuration of [Al (52A)/ITO (52B)] are formed on the surfaces of the drain electrode 25B and the planarizing insulating film 26 and on the electrically-conductive layer 51 in the terminal section 50.

Figure 7C:
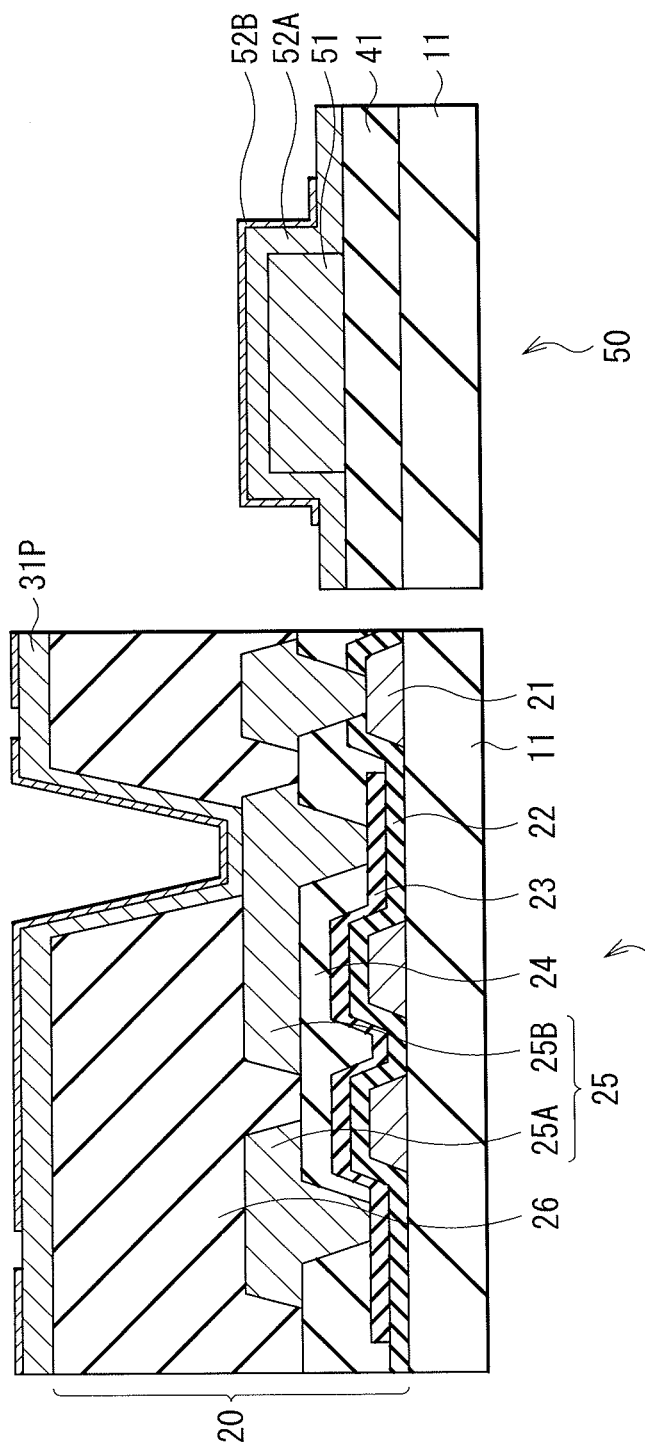
FIG. 7C is a cross-sectional view illustrating a step following the step of FIG. 7B.
Figure 8A:
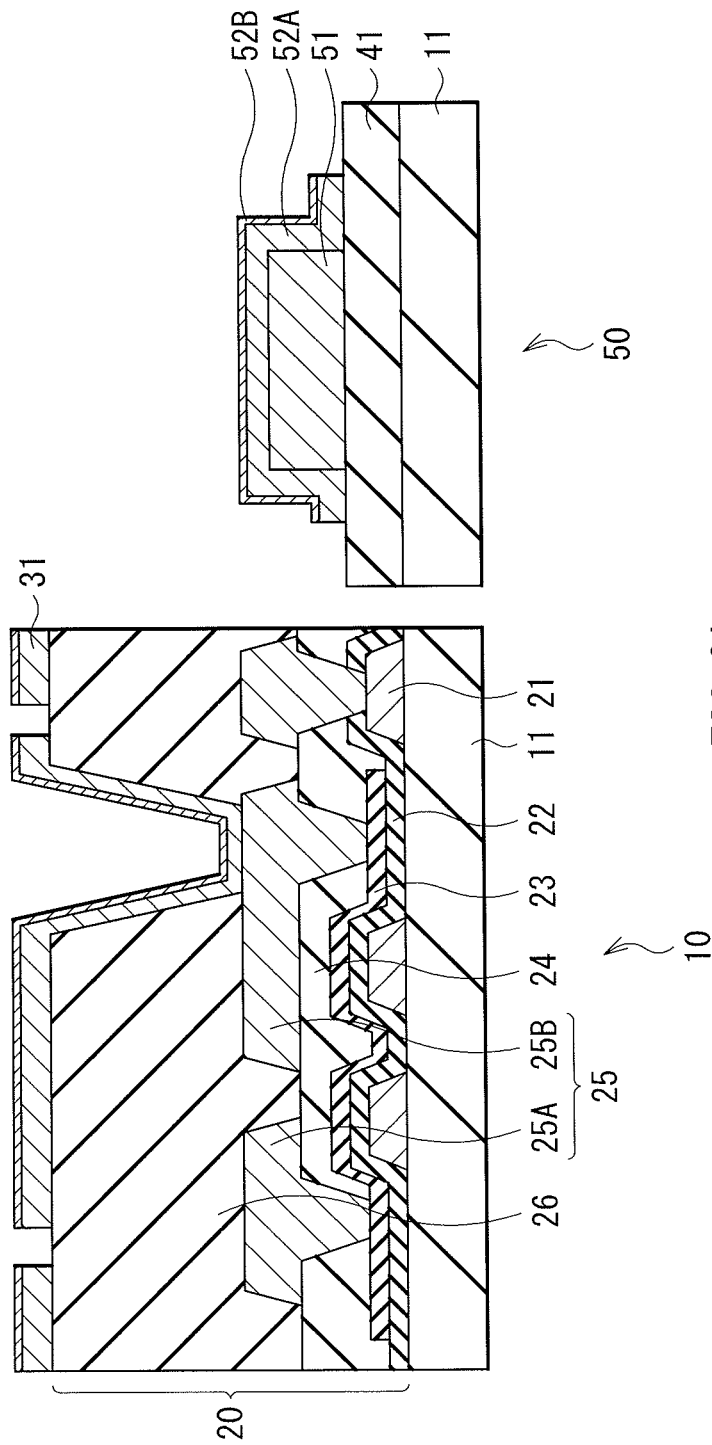
FIG. 8A is a cross-sectional view illustrating a step following the step of FIG. 7C.
Figure 8B:
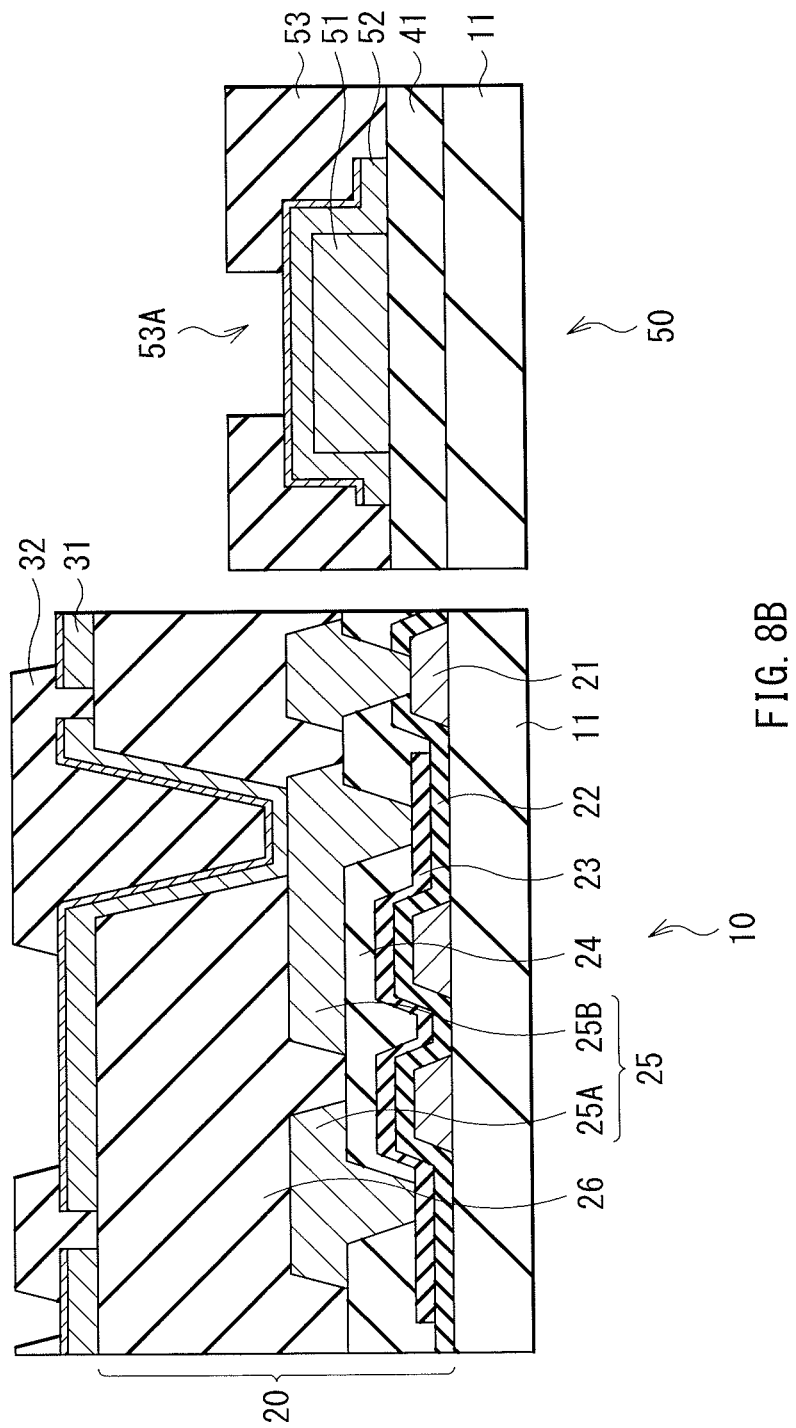
FIG. 8B is a cross-sectional view illustrating a step following the step of FIG. 8A.
Figure 8C:
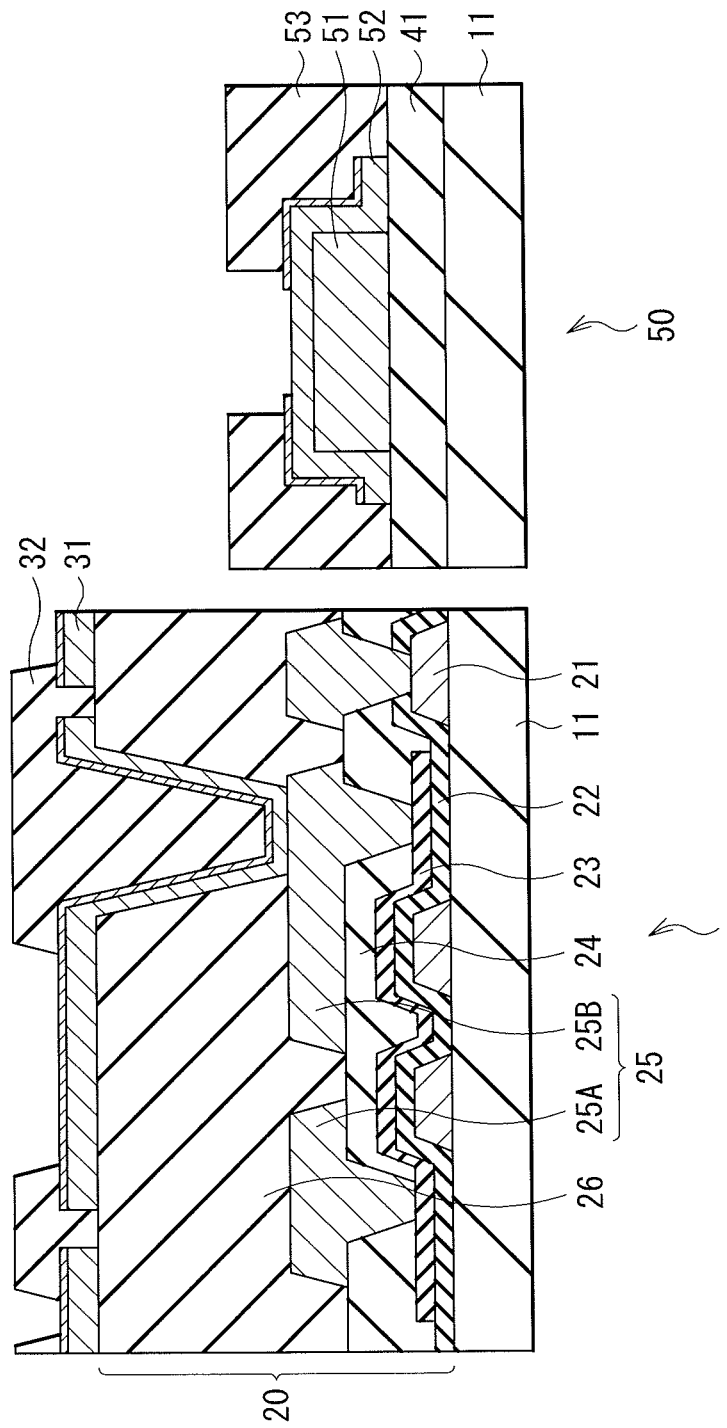
FIG. 8C is a cross-sectional view illustrating a step following the step of FIG. 8B.

Next, ITO is selectively removed to obtain a predetermined shape as illustrated in FIG. 7C. At this time, a portion of ITO (52B) in the terminal section 50 is not removed. Subsequently, as illustrated in FIG. 8A, the pixel electrode 31 and the electrically-conductive layer 52 (52A and 52B) are processed. Thereafter, as illustrated in FIG. 8B, the window-like interelectrode insulating film 32 defining the light emission region and the insulating film 53 having the opening 53A are formed. Next, as illustrated in FIG. 8C, the electrically-conductive layer 52B in the opening 53A is etched, specifically, is removed to obtain an opening having the substantially-same shape as that of the opening 53A, and thereby, the electrically-conductive layer 52 is electrically conducted to the external circuit. Thereafter, the organic layer 33 including the light emission layer is formed in the pixel section 10 by an evaporation method. Thereafter, the sealing substrate 36 is bonded thereto with the sealing layer 35 in between. Finally, an FPC for connecting with the external circuit is mounted on the terminal section 40, and thereby, the display unit 2 is completed.

In a display unit in which a pixel electrode has a laminated structure configured of a metal film and a transparent electrode film, in the case where this pixel electrode is used as a terminal section connected to an external circuit, there are disadvantages that an average mounting resistance value is increased more compared to in a display unit not using the pixel electrode as a terminal section, and that variations in resistance value are significantly increased and display unevenness occurs. One reason for this is that, in the case where a reflective electrode film and a transparent electrode, for example, an Al—Ni alloy and ITO are directly contacted, a partial ohmic contact section through $Al_3Ni$-layer particles and a non-ohmic contact section through an Al oxide film exist in a mixed manner. Another reason for this may be that an electrically-conductive filler of a mounted member and the surface of the terminal section are point-contacted.

In contrast, in this embodiment, the terminal section 50 has the laminated structure configured of the electrically-conductive layer 51 formed in the same step as of the step of forming the wiring layer and the electrically-conductive layer 52 formed in the same step as of the step of forming the pixel electrode 31. In the manufacturing step thereof, at the time of processing the pixel electrode 31, the transparent electrode film 52B provided in the electrically-conductive layer 52 in the terminal section 50 is left, and is used as a protective film at the time of etching the reflective electrode film 52A. Thereby, the electrically-conductive layer 51 and the electrically-conductive layer 52 (the reflective electrode film 52A) configuring the terminal section 50 are prevented from being damaged by the etching. Further, the transparent electrode film 52B on the top surface of the terminal section 50 is removed after patterning the pixel electrode 31. Thereby, increase in the resistance value in the terminal section 50 is prevented.

As described above, in the display unit 2 and the method of manufacturing the display unit 2 in this embodiment, by using the transparent electrode film 52B as a protective film at the time of processing the reflective electrode film 52A, the terminal section 50 is normally formed. Further, by finally removing the transparent electrode film 52B in the terminal section 50, increase in the resistance value in the terminal section 50 is prevented. Therefore, variations in characteristics are decreased, and manufacturing yield is improved. That is, a highly-reliable display unit is allowed to be provided.

4. MODIFICATION 1

Figure 9:
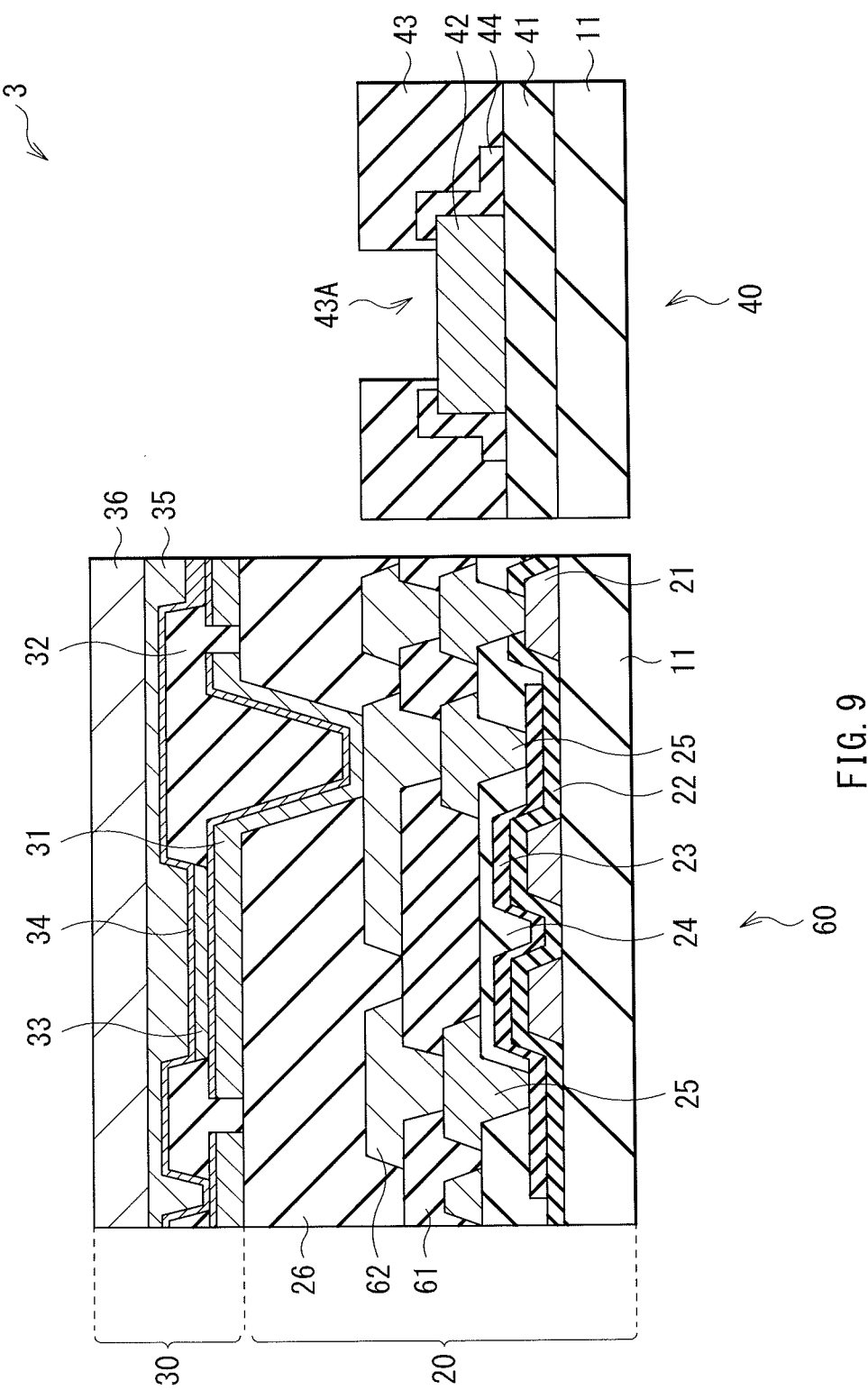
FIG. 9 is a cross-sectional view illustrating a configuration of a display unit according to Modification 1 of the first embodiment.

FIG. 9 illustrates cross-sectional configurations of a pixel section 60 and the terminal section 40 of a display unit 3 in a modification of the foregoing first embodiment. The display unit 3 is different from the display unit in the foregoing first embodiment in that the semiconductor layer 20 configuring the pixel section 60 is configured of a multilayer wiring. This semiconductor layer 20 may have a configuration in which an interlayer insulating film 61 formed, for example, of a resin material such as polyimide and a wiring layer 62 formed of a metal material similar to that of the gate electrode 21, the source electrode 25A, and the drain electrode 25B are layered between respective layers configuring the thin film transistor 20A and the planarizing insulating film 26. It is to be noted that, for forming the electrically-conductive layer 42 configuring the terminal section 40 in this modification, the wiring layer 62 may be used other than the gate electrode 21 or the source electrode 25A and the drain electrode 25B. In this case, the wiring layer 62 is made of a material having the same etching characteristics as those of the pixel electrode 31 (in particular, the reflective electrode film 31A).

Figure 10A:
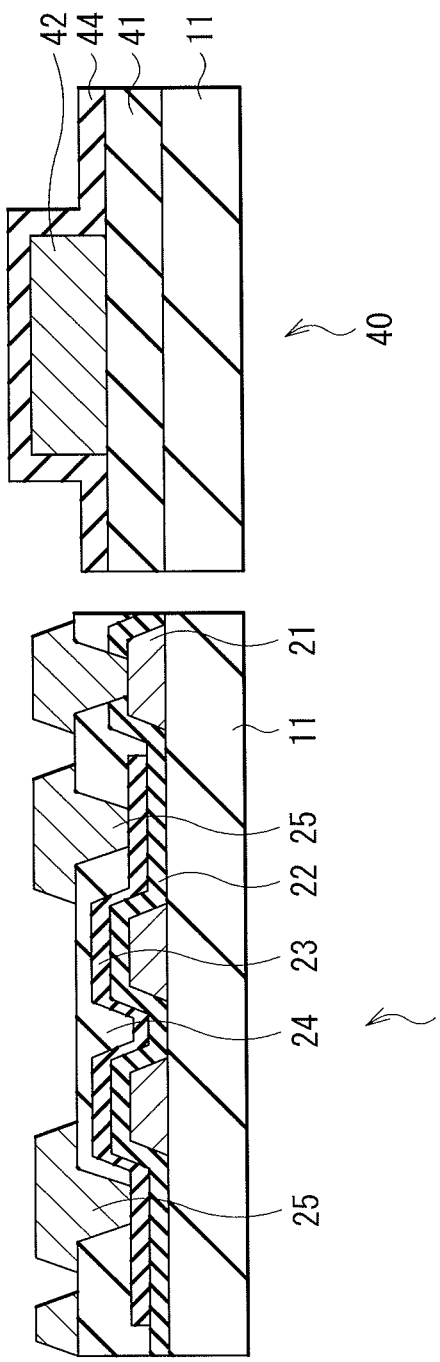
FIG. 10A is a cross-sectional view illustrating a method of manufacturing the display unit illustrated in FIG. 9 in order of steps.
Figure 10B:
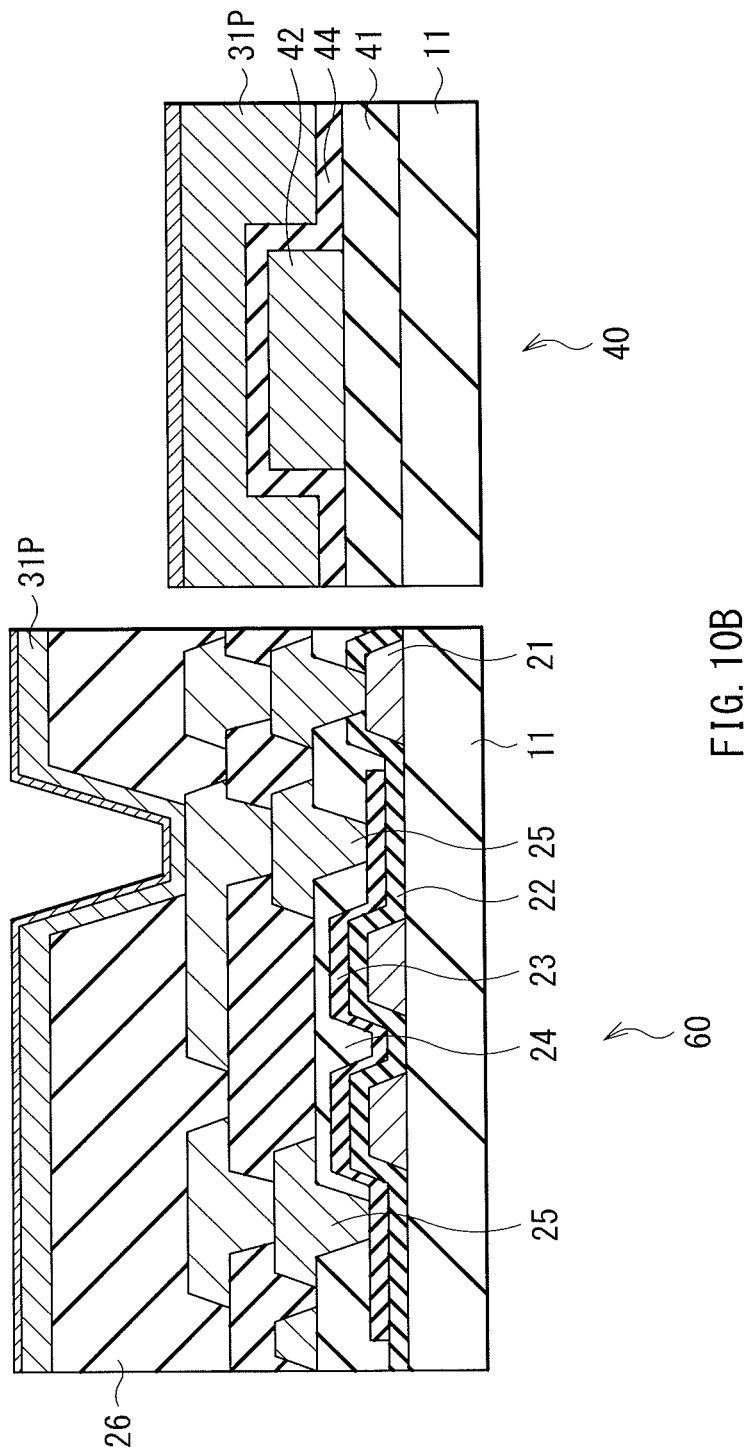
FIG. 10B is a cross-sectional view illustrating a step following a step of FIG. 10A.

The display unit 3 in this modification may be manufactured as follows. First, the source electrode 25A, the drain electrode 25B, and the electrically-conductive layer 42 are formed as illustrated in FIG. 10A by a method similar to that in the foregoing first embodiment, and thereafter, the protective film 44 is formed in the terminal section 40. Subsequently, as illustrated in FIG. 10B, the interlayer insulating film 61 and the wiring layer 62 are formed on the interlayer insulating film 24, the source electrode 25A, and the drain electrode 25B, and thereafter, the planarizing insulating film 26 and a pixel electrode film 31P are formed in order. Further, the pixel electrode film 31P is also formed on the protective film 44 in the terminal section 40.

Figure 10C:
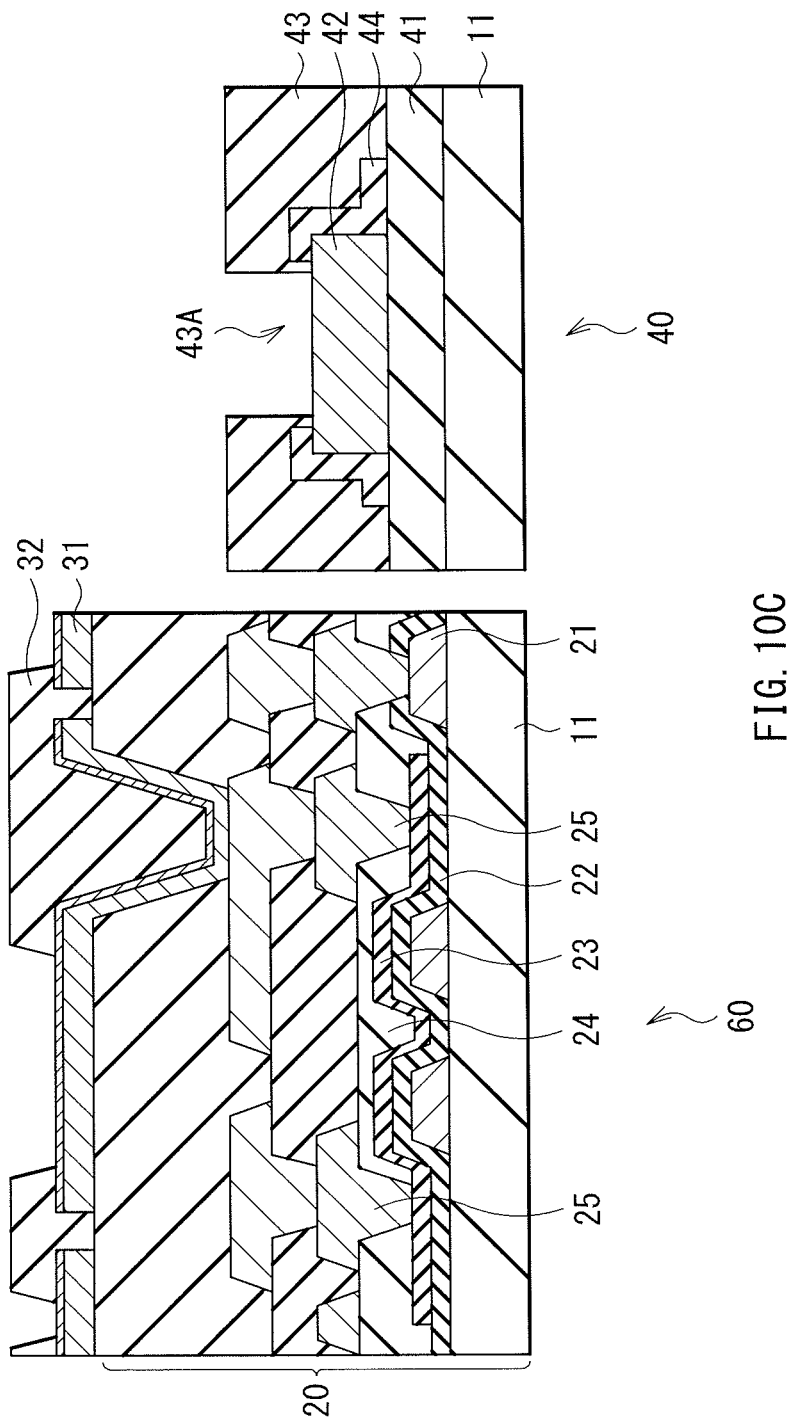
FIG. 10C is a cross-sectional view illustrating a step following the step of FIG. 10B.

Next, as illustrated in FIG. 10C, a portion of the pixel electrode film 31P on the whole surface of the terminal section 40 is removed by wet etching, and the pixel section 10 is processed. Thereafter, a portion, of the protective film 44 in the terminal section 40, to be a connection section with respect to an external circuit may be selectively removed by dry-etching with the use, for example, of SF6 or the like. Subsequently, as illustrated in FIG. 10C, the insulting film 43 is formed on the window-like interelectrode insulating film 32 defining the light emission region and the terminal section 40. Thereafter, the organic layer 33 including the light emission layer is formed in the pixel section 60 by an evaporation method, and thereafter, the sealing substrate 36 is bonded thereto with the sealing layer 35 in between. Finally, an FPC for connecting with the external circuit is mounted on the terminal section 40, and thereby, the display unit 3 is completed.

5. MODIFICATION 2

Figure 11:
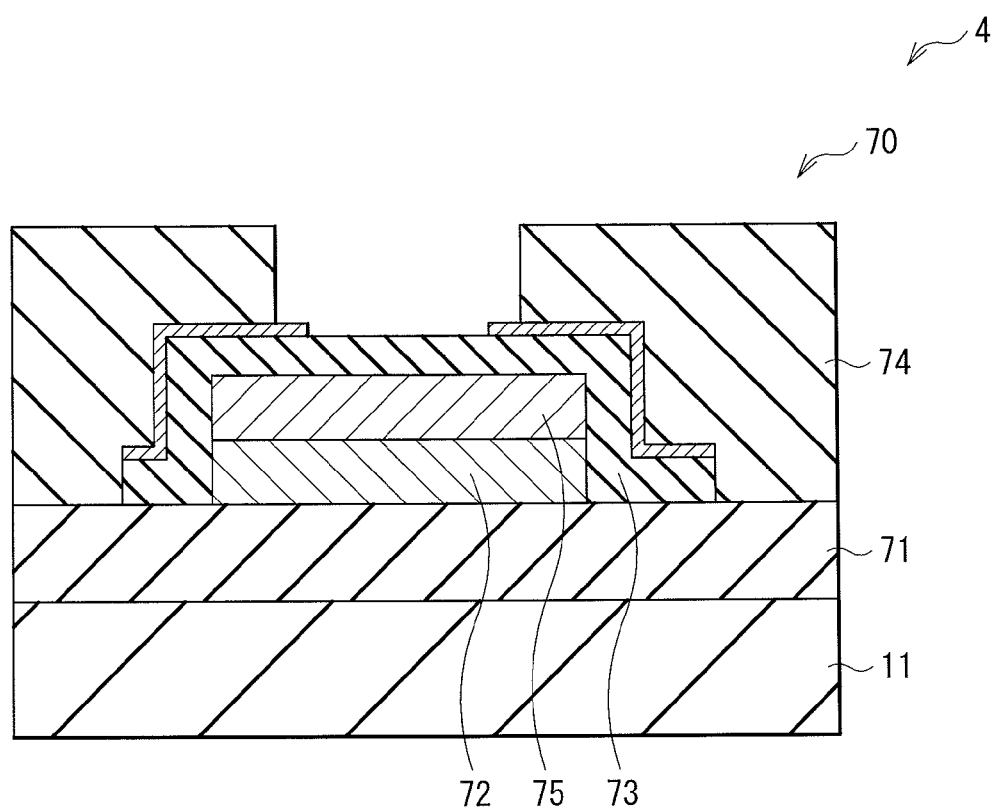
FIG. 11 is a cross-sectional view illustrating a configuration of a terminal section of a display unit according to Modification 2 of the second embodiment.

FIG. 11 illustrates a cross-sectional configuration of a terminal section 70 of a display unit 4 in a modification of the foregoing second embodiment. The display unit 4 is different from the display unit in the foregoing second embodiment in that the semiconductor layer 20 has a multilayer wiring structure as in the foregoing Modification 1, and an electrically-conducive layer configuring the terminal section 70 has a trilayer structure. This electrically-conducive layer may have, for example, a configuration in which an electrically-conducive layer 72 formed in the same step as of the step of forming the source electrode 25A and the drain electrode 25B, an electrically-conducive layer 75 formed in the same step as of the step of forming the wiring layer 62, and an electrically-conducive layer 73 formed in the same step as the step of forming the pixel electrode 31 are layered in this order. It is to be noted that, the electrically-conducive layer 72 may be formed in the same step as that of the gate electrode 21.

Figure 12A:
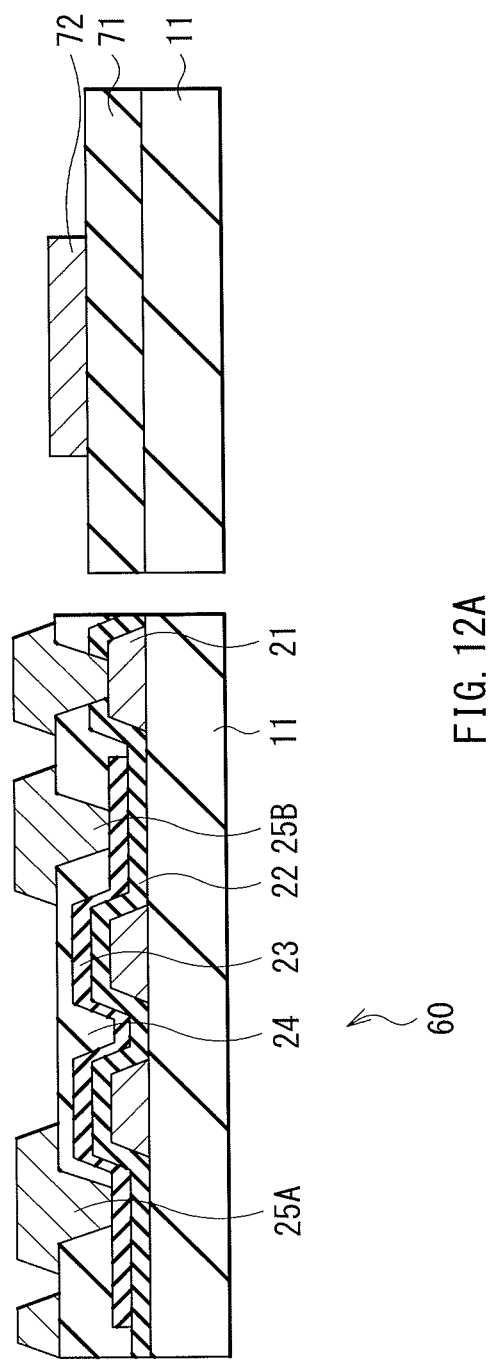
FIG. 12A is a cross-sectional view illustrating a method of manufacturing the display unit illustrated in FIG. 11 in order of steps.
Figure 12B:
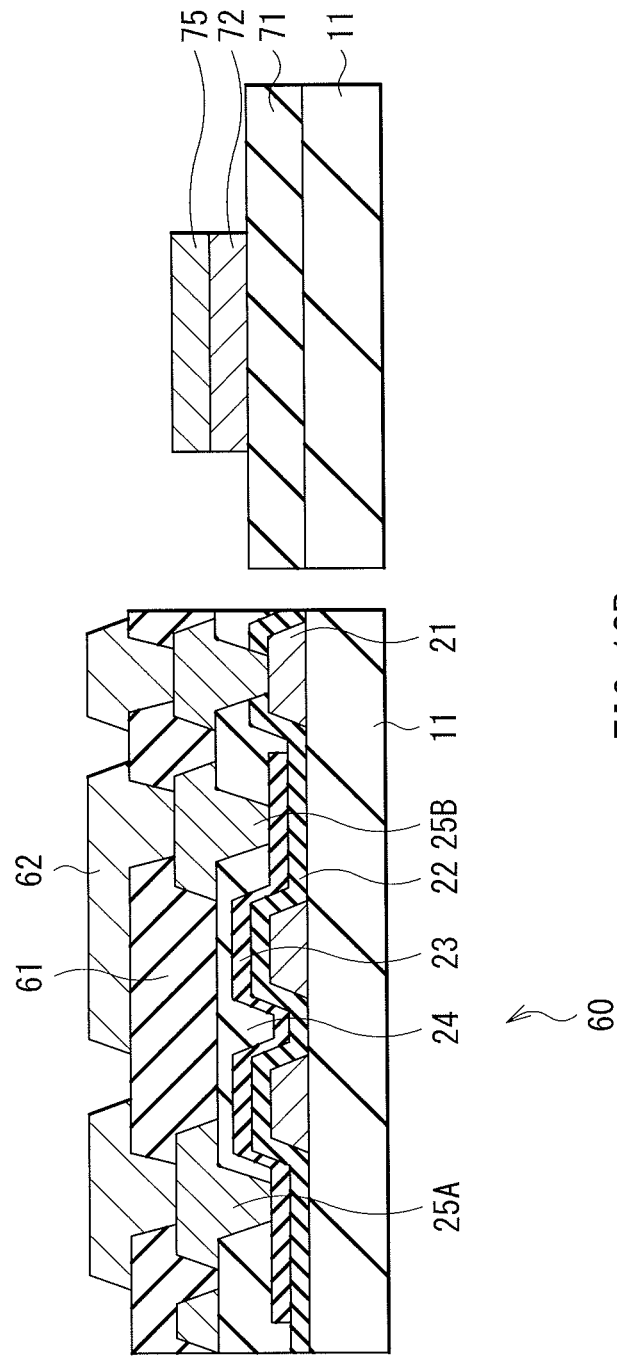
FIG. 12B is a cross-sectional view illustrating a step following a step of FIG. 12A.

The display unit 4 in this modification may be manufactured as follows. First, the source electrode 25A, the drain electrode 25B, and the electrically-conductive layer 72 on an insulating film 71 are formed as illustrated in FIG. 12A by a method similar to that in the foregoing second embodiment. Subsequently, as illustrated in FIG. 12B, the interlayer insulating film 61 and the wiring layer 62 are formed on the interlayer insulating film 24, the source electrode 25A, the drain electrode 25B, and the electrically-conductive layer 51; and the electrically-conducive layer 75 is formed on the electrically-conductive layer 72 in the terminal section 70.

Figure 12C:
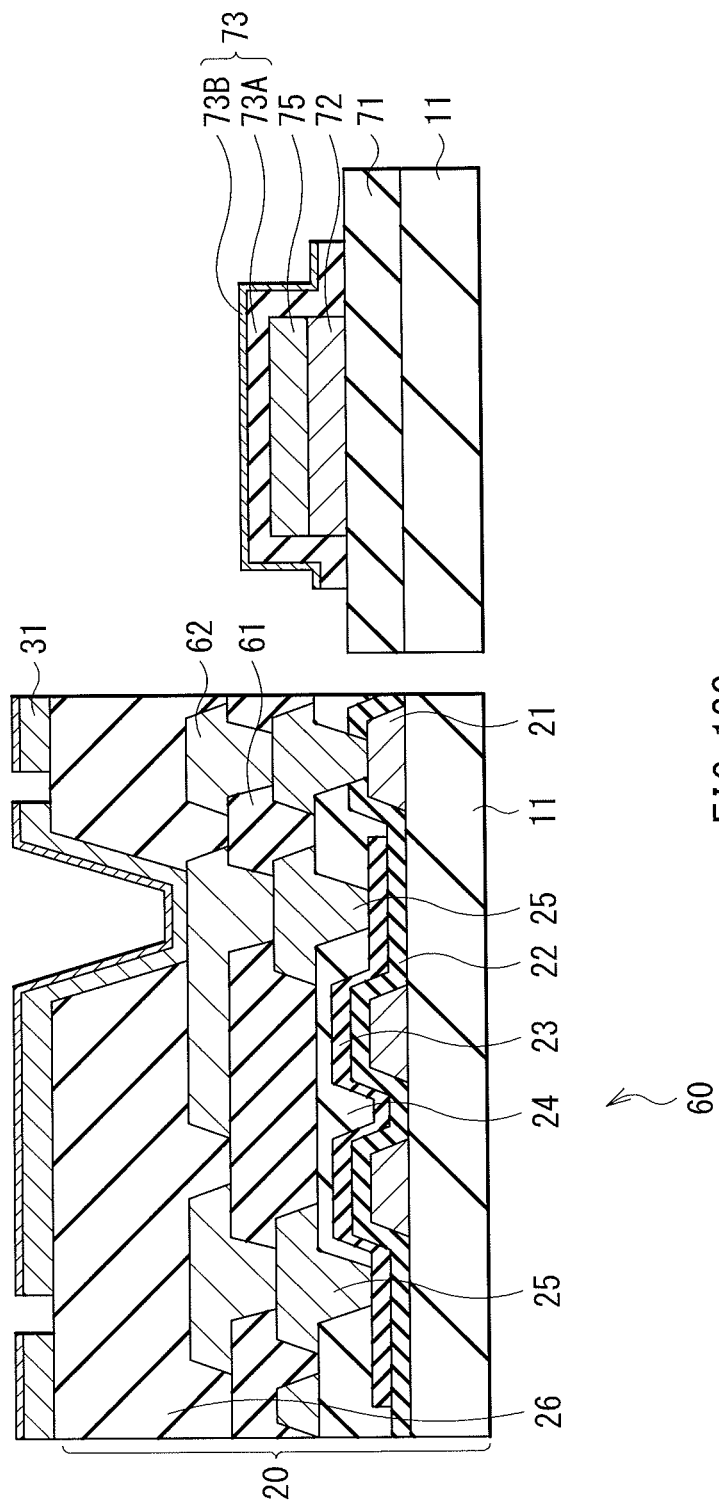
FIG. 12C is a cross-sectional view illustrating a step following the step of FIG. 12B.
Figure 12D:
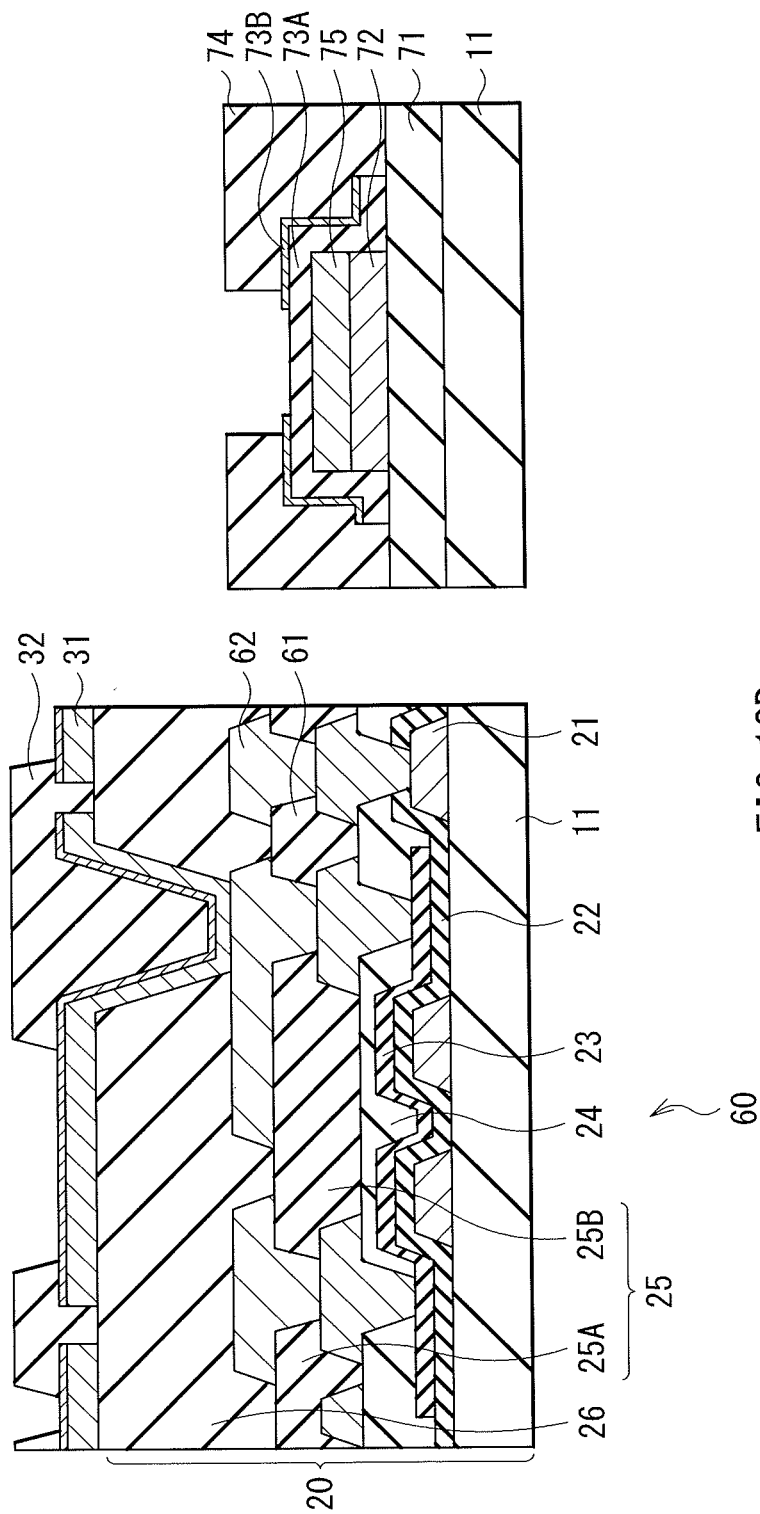
FIG. 12D is a cross-sectional view illustrating a step following the step of FIG. 12C.

Next, as illustrated in FIG. 12C, the planarizing insulating film 26, the pixel electrode 31, and the electrically-conducive layer 73 are formed. Thereafter, as illustrated in FIG. 12D, the window-like interelectrode insulating film 32 defining the light emission region and an insulting film 74 are formed. Further, out of the electrically-conducive layer 73 (a reflective electrode film 73A and a transparent electrode film 73B) formed concurrently with the pixel electrode 31 in the terminal section 70, the transparent electrode film 73B that has served as a protective film is removed. Thereafter, the organic layer 33 included in the pixel section 60 is formed by an evaporation method, and thereafter, the sealing substrate 36 is bonded thereto with the sealing layer 35 in between. Finally, an FPC for connecting with the external circuit is mounted on the terminal section 70, and thereby, the display unit 4 is completed.

Display units are desired to further be larger in size and have higher resolution. In the case where a display unit becomes larger in size, signal delay occurs due to a load resulting from a wiring resistance and a parasitic capacitance. Further, in the case of achieving higher resolution, as the number of pixels is increased, density of a wiring layer in which a drive wiring and a signal line are formed is increased particularly in an organic EL display unit, and thereby, the number of short-circuit faults is increased, and manufacturing yield is lowered, disadvantageously. One method to resolve the foregoing disadvantages may be a method to allow a layer in which various wirings are formed to have a multilayer structure. In a case of achieving the multilayer structure of the wiring layer in the embodiments of the present application, the photosensitive resin such as polyimide having low electric constant is used between the wiring layers having the multilayer structure is used in order to avoid signal delay. However, the foregoing resin-based materials have low resistance to dry etching. Therefore, in the case where the wiring layer on the photosensitive interlayer insulating resin is processed by dry etching, for example, a hollow may be created in the insulating film leading to short-circuit between the upper and lower wiring layers, or appearance unevenness may occur due to roughness of the surface of the insulating film. Therefore, for example, manufacturing yield may be easily lowered, and quality variations and the like may easily occur.

Therefore, the wiring layer 62 added in order to achieve multilayer wiring structure may be preferably made of a material processable by wet etching such as laminated metal having a configuration of [Mo/Al]. According to Modifications 1 and 2, for example, in Modification 1, the electrically-conductive layer 42 in the terminal section 40 is formed in the same step as of the step of forming the gate electrode 21, of the step of forming the source electrode 25A and the drain electrode 25B, or of the step of forming the wiring layer 62, and thereafter, the protective film 44 is formed on the electrically-conductive layer 42. In Modification 2, the electrically-conducive layer configuring the terminal section 70 has a trilayer structure (configured of the electrically-conducive layers 72, 75, and 73), and in the step of formation thereof, the transparent electrode film 73B is formed in the uppermost layer. Therefore, in the case where the semiconductor layer 20 has the multilayer wiring structure including the interlayer insulating film 61 formed of the photosensitive resin material, the electrically-conducive layer 42 of the terminal section 40 (or the electrically-conductive layers 72, 75, and 73 in the terminal section 70) is prevented from being damaged by etching. Therefore, a larger-size and high-definition display unit that has high manufacturing yield and superior reliability is provided.

6. MODIFICATION 3

Figure 13:
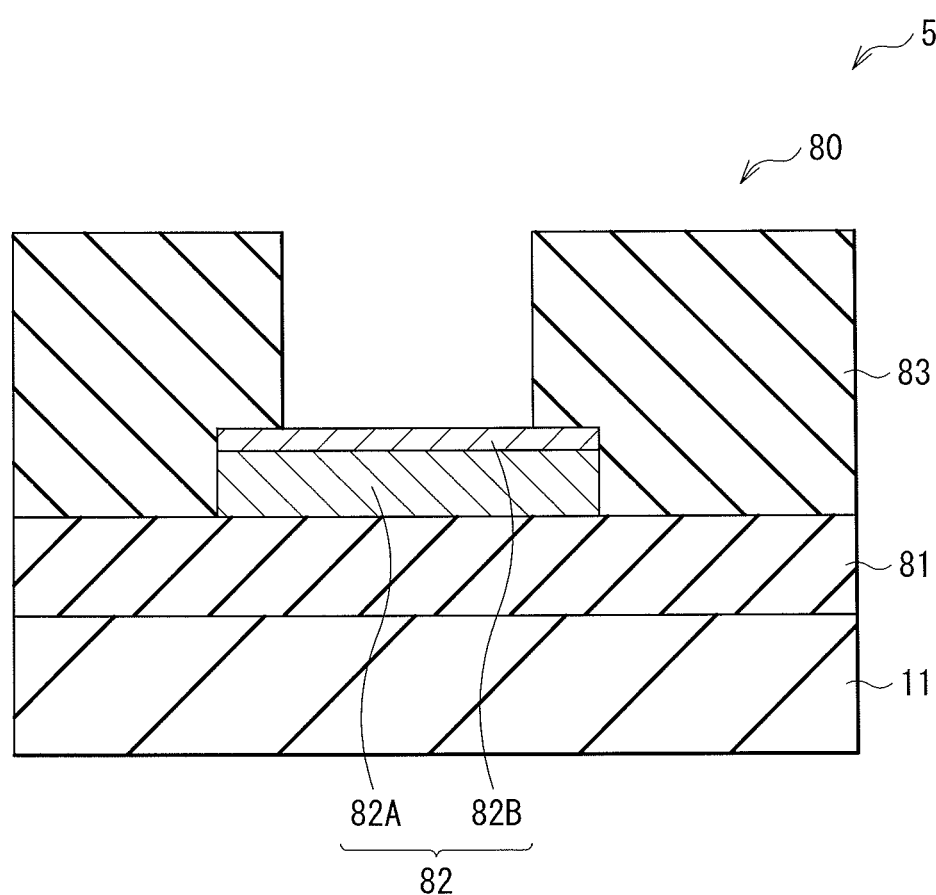
FIG. 13 is a cross-sectional view illustrating a configuration of a terminal section of a display unit according to Modification 3 of the second embodiment.

FIG. 13 illustrates a cross-sectional configuration of a terminal section 80 of a display unit 5 in a modification of the foregoing second embodiment. The display unit 5 has a configuration in which each of the source electrode 25A and the drain electrode 25B is configured of a laminated structure made of different metal materials having different etching characteristics. Specifically, in the source electrode 25A and the drain electrode 25B, for example, an Al alloy and Ti (or W) may be laminated in order from the substrate 11. In an electrically-conductive layer in the terminal section 80 formed in the same step as of the step of forming the source electrode 25A and the drain electrode 25B, an electrically-conducive layer 82A made of an Al alloy and an electrically-conducive layer 82B made of Ti (or W) are also laminated in this order.

Figure 14A:
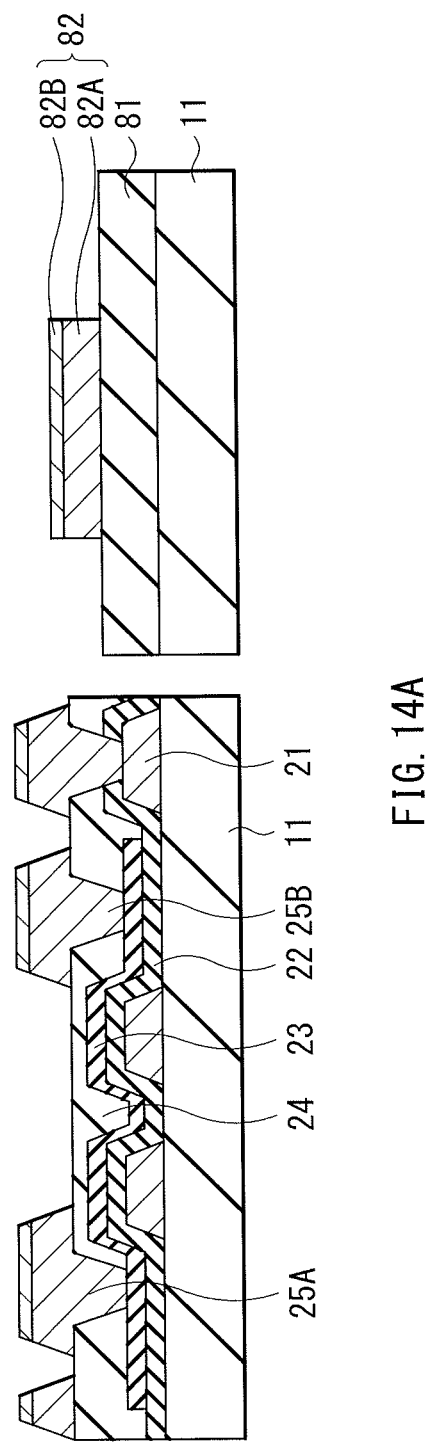
FIG. 14A is a cross-sectional view illustrating a method of manufacturing the display unit illustrated in FIG. 13 in order of steps.
Figure 14B:
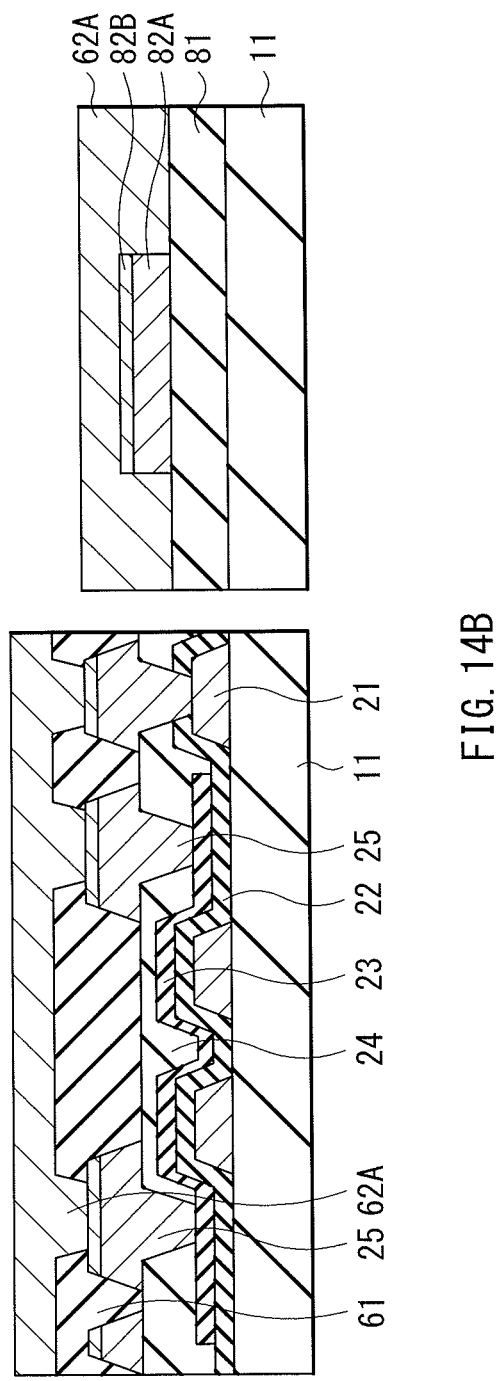
FIG. 14B is a cross-sectional view illustrating a step following a step of FIG. 14A.
Figure 14C:
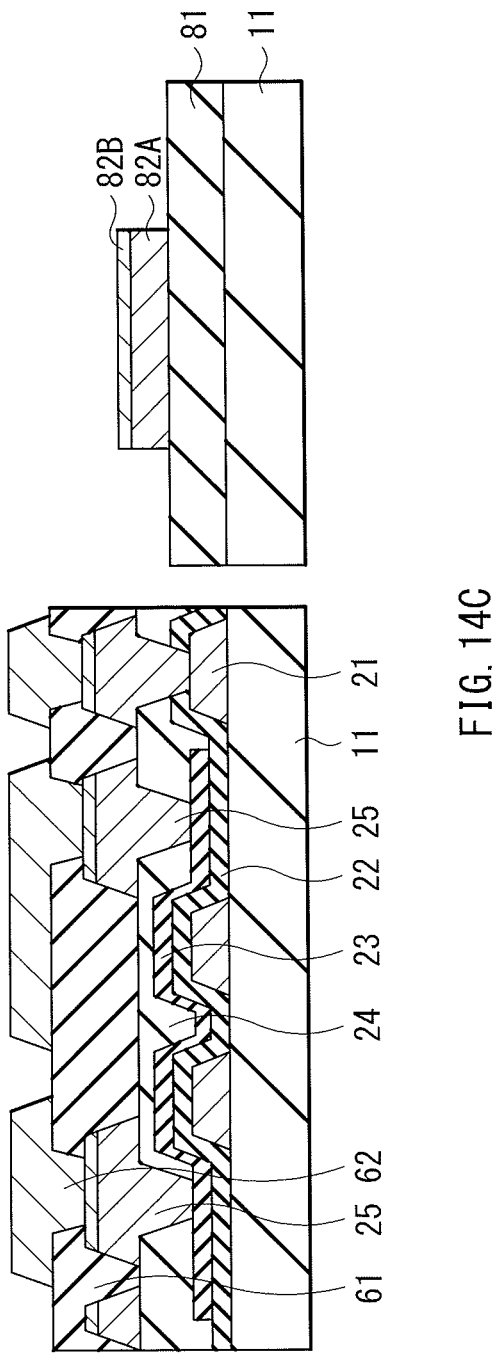
FIG. 14C is a cross-sectional view illustrating a step following the step of FIG. 14B.

The display unit 5 in this modification may be manufactured as follows. First, the source electrode 25A, the drain electrode 25B, and an electrically-conductive layer 82 (the electrically-conductive layers 82A and 82B) are formed as illustrated in FIG. 14A by a method similar to that in the foregoing first embodiment. At this time, each of the source electrode 25A, the drain electrode 25B, and the electrically-conductive layer 82 (the electrically-conductive layers 82A and 82B) has a laminated structure made of metal materials having etchant characteristics different from those of the material of the wiring layer 62, that may be a laminated structure of [Ti/Al], for example. Subsequently, as illustrated in FIG. 14B, the interlayer insulating film 61 and the metal film 62A are formed on the interlayer insulating film 24, the source electrode 25A, the drain electrode 25B, and the electrically-conducive layer 82. Next, as illustrated in FIG. 14C, the metal film 62A in the pixel section 60 is processed to form the wiring layer 62, and the metal film 62A in the terminal section 80 is removed. At this time, the electrically-conductive layer 82B (the Ti layer in the laminated structure of [Ti/Al]) serves as an etching protective film.

Figure 15A:
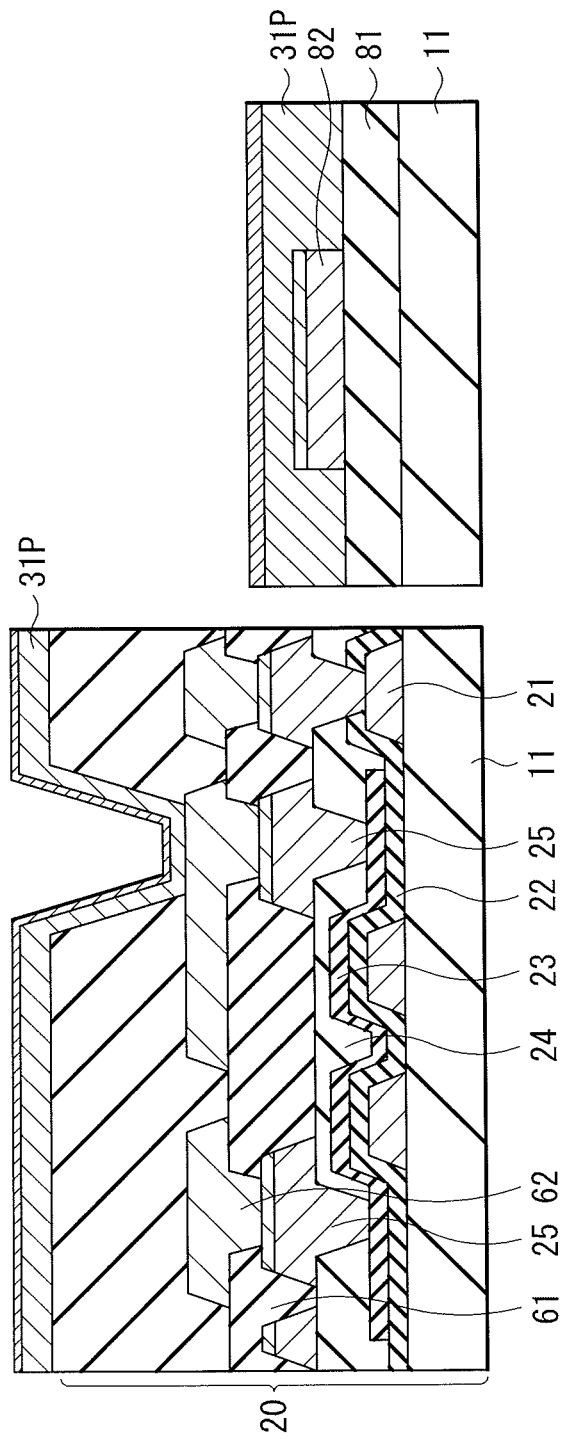
FIG. 15A is a cross-sectional view illustrating a step following the step of FIG. 14C.
Figure 15B:
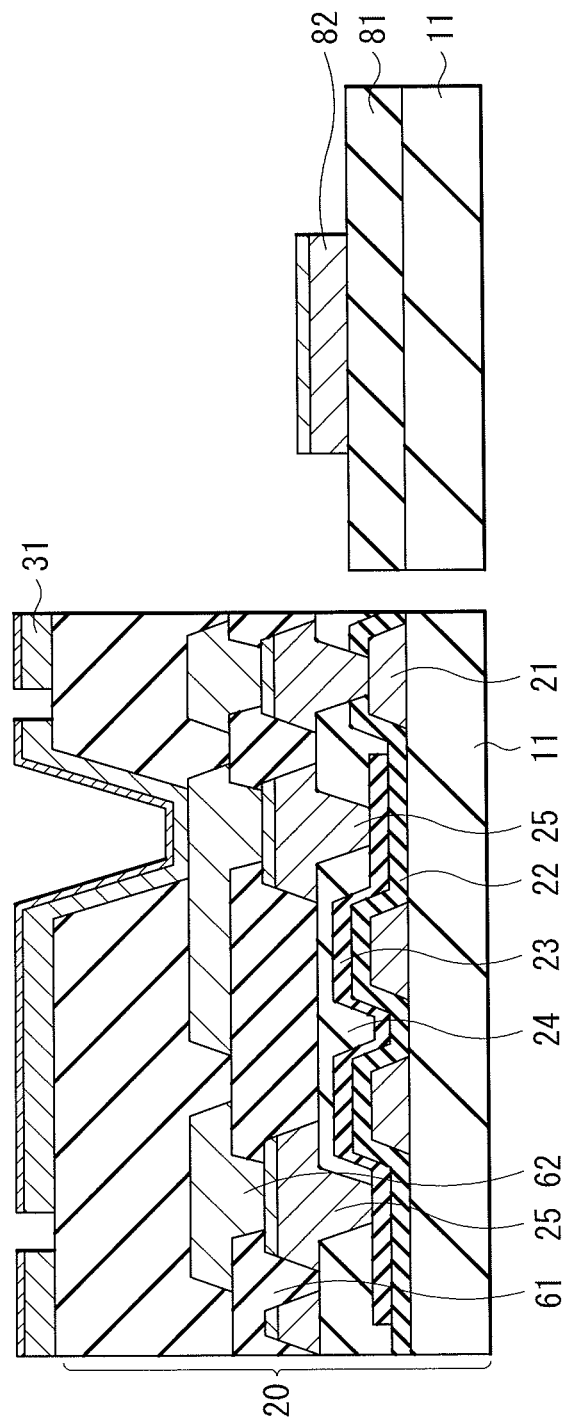
FIG. 15B is a cross-sectional view illustrating a step following the step of FIG. 15A.
Figure 15C:
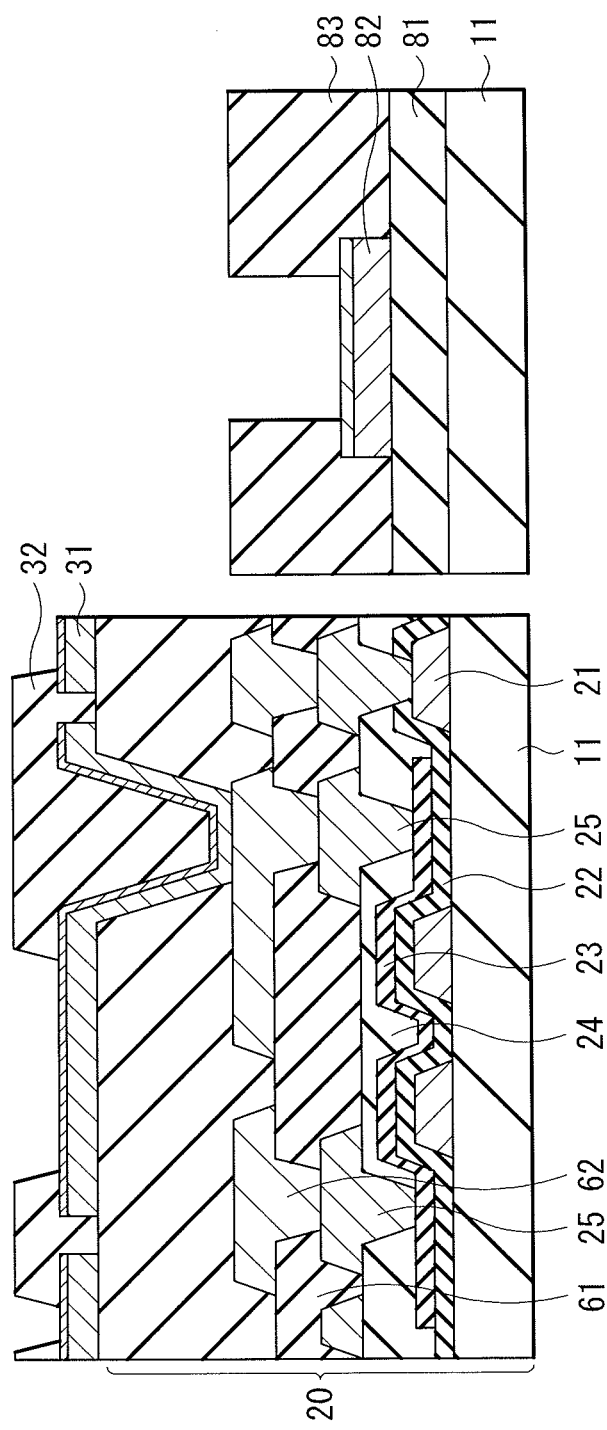
FIG. 15C is a cross-sectional view illustrating a step following the step of FIG. 15B.

Subsequently, as illustrated in FIG. 15A, after the planarizing insulating film 26 is formed, the pixel electrode film 31P is formed on the whole surfaces of the planarizing insulating film 26 and the terminal section 80. Next, as illustrated in FIG. 15B, the pixel electrode film 31P is patterned to form the pixel electrode 31, and a portion of the pixel electrode film 31P in the terminal section 80 is removed. Subsequently, as illustrated in FIG. 15C, the window-like interelectrode insulating film 32 defining the light emission region and an insulting film 83 on the terminal section 80 are formed by forming and processing an insulating film. Thereafter, the organic layer 33 including the light emission layer is formed in the pixel section 60 by an evaporation method, and thereafter, the sealing substrate 36 is bonded thereto with the sealing layer 35 in between. Finally, an FPC for connecting with an external circuit is mounted on the terminal section 80, and thereby, the display unit 5 is completed.

As described above, in the case where any of the wiring layers (the gate electrode 21, the source electrode 25A, the drain electrode 25B, and the wiring layer 62) formed in the semiconductor layer 20 has a laminated structure made of materials having different etching characteristics, in particular, in the case where a material of the upper layer thereof has etching characteristics different from those of the pixel electrode 31, the terminal section 80 is normally formed without separately forming a protective film as in the foregoing first embodiment and Modification 1.

7. APPLICATION EXAMPLES

The display units 1 to 5 explained above in the first and the second embodiments and Modifications 1 to 3 may be suitably used, for example, as the following electronic apparatuses.

Application Example 1

Figure 16A:
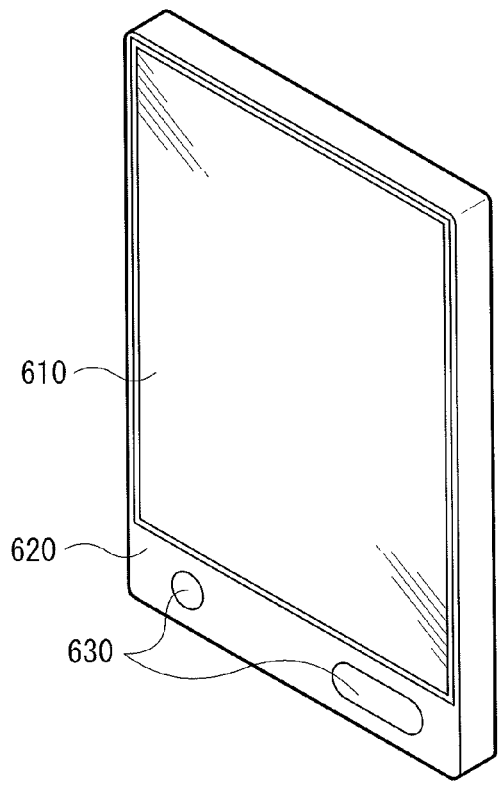
Figure 16B:
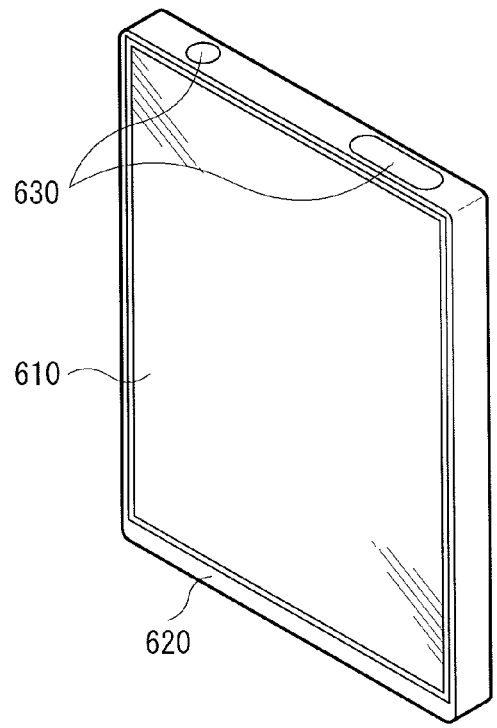

FIG. 16A illustrates an appearance of a smartphone from the front side thereof, and FIG. 16B illustrates an appearance from the rear side thereof. The smartphone may include, for example, a display section 610 (the display unit 1), a non-display section (a package) 620, and an operation section 630. The operation section 630 may be provided on the front surface of the non-display section 620 as illustrated in FIG. 16A, or may be provided on the top surface of the non-display section 620 as illustrated in FIG. 16B.

Application Example 2

Figure 17:
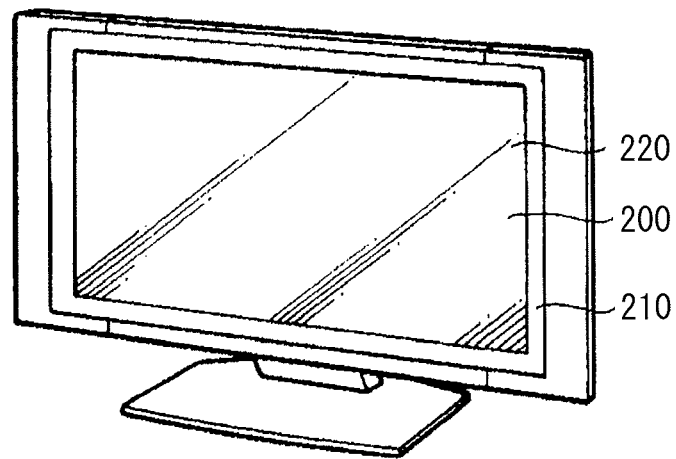
FIG. 17 is a perspective view illustrating an appearance of Application example 2.

FIG. 17 illustrates an appearance of a television according to Application example 2. The television may have, for example, an image display screen section 200 including a front panel 210 and a filter glass 220. The image display screen section 200 corresponds to any of the foregoing display units.

Application Example 3

Figure 18A:
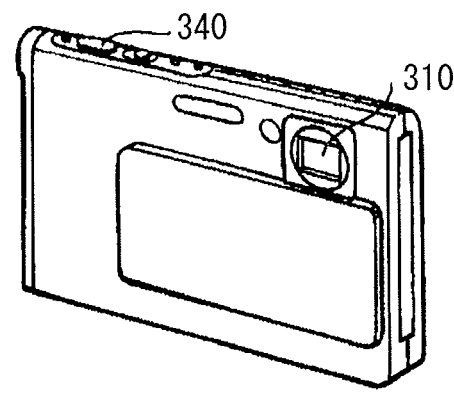
FIG. 18A is a perspective view illustrating an appearance viewed from the front side of Application example 2.
Figure 18B:
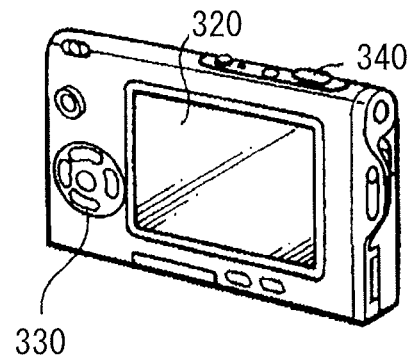
FIG. 18B is a perspective view illustrating an appearance viewed from the rear side of Application example 2.

FIG. 18A illustrates an appearance of a digital camera according to Application example 3 that is viewed from the front side, and FIG. 18B illustrates an appearance thereof that is viewed from the rear side. The digital camera may have, for example, a light emitting section 310 for a flash, a display section 320 as any of the foregoing display units, a menu switch 330, and a shutter button 340.

Application Example 4

Figure 19:
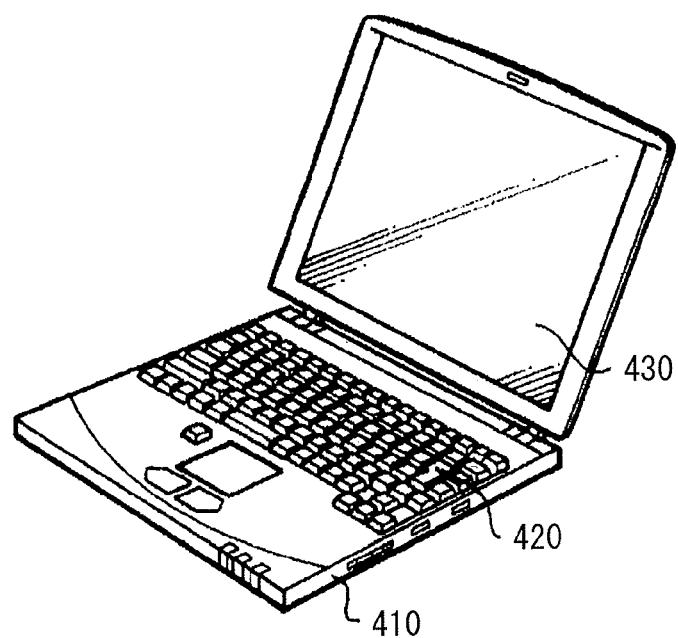
FIG. 19 is a perspective view illustrating an appearance of Application example 3.

FIG. 19 illustrates an appearance of a notebook personal computer according to Application example 4. The notebook personal computer may have, for example, a main body 410, a keyboard 420 for operation of inputting characters and the like, and a display section 430 as any of the foregoing display units.

Application Example 5

Figure 20:
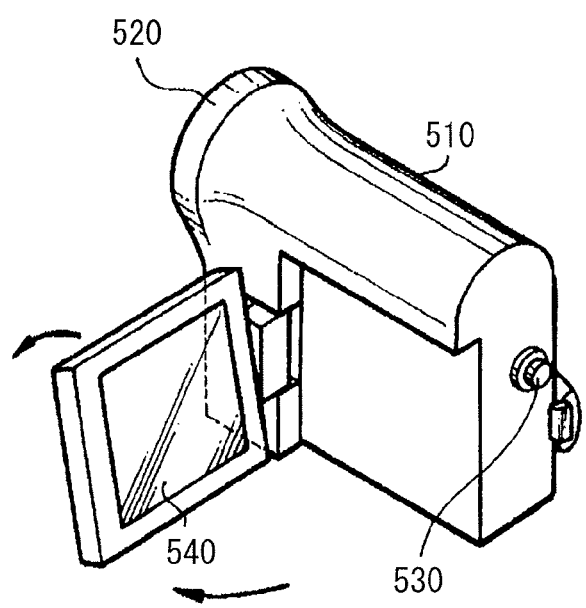
FIG. 20 is a perspective view illustrating an appearance of Application example 4.

FIG. 20 illustrates an appearance of a video camcorder according to Application example 5. The video camcorder may have, for example, a main body 510, a lens 520 for shooting a subject provided on the front side surface of the main body 510, a start-stop switch 530 for shooting, and a display section 540 as any of the foregoing display units.

Application Example 6

Figure 21A:
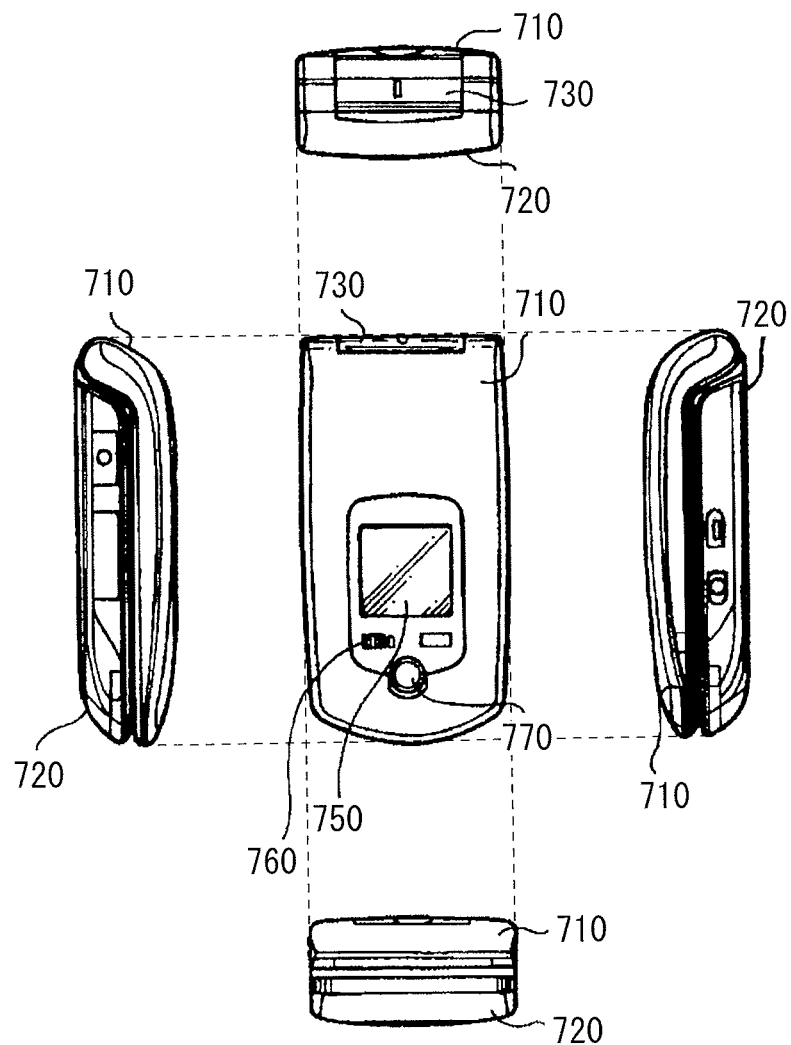
FIG. 21A illustrates an elevation view of Application example 5 in a closed state, a left side view thereof, a right side view thereof, a top view thereof, and a bottom view thereof.
Figure 21B:
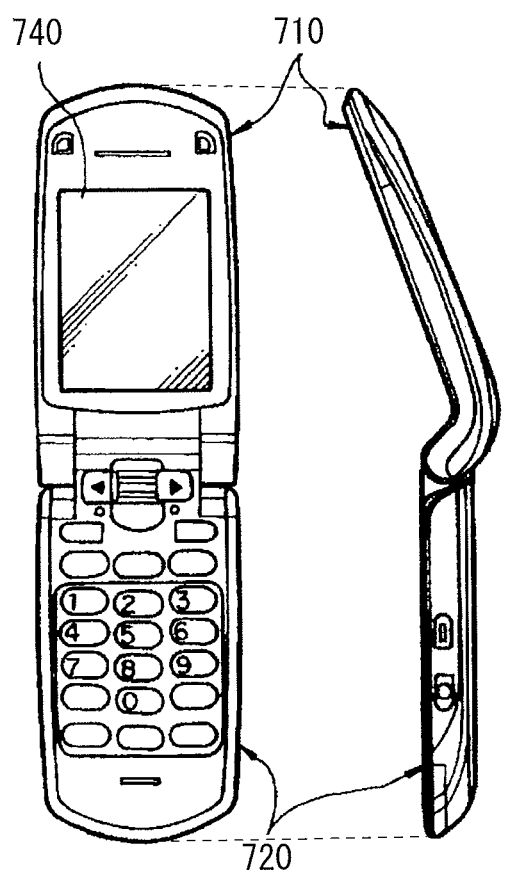
FIG. 21B illustrates an elevation view of Application example 5 in an open state and a side view thereof.

FIG. 21A illustrates an elevation view of a mobile phone according to Application example 6 in a closed state, a left side view thereof, a right side view thereof, a top view thereof, and a bottom view thereof. FIG. 21B illustrates an elevation view of the mobile phone in an open state and a side view thereof. In the mobile phone, for example, an upper package 710 and a lower package 720 may be jointed by a joint section (a hinge section) 730. The mobile phone may have a display 740, a sub-display 750, a picture light 760, and a camera 770. One of the display 740 and the sub-display 750 corresponds to any of the foregoing display units.

While the present disclosure has been described with reference to the first and the second embodiments, Modifications 1 to 3, and the application examples, the present disclosure is not limited to the foregoing embodiments and the like, and various modifications may be made. For example, the material, the thickness, the film-forming method, the film-forming conditions, and the like of each layer are not limited to those described in the foregoing embodiments and the like, and other materials, other thicknesses, other film-forming methods, and other film-forming conditions may be adopted.

It is possible to achieve at least the following configurations from the above-described example embodiments and the modifications of the disclosure.

(1) A display unit including:
a display layer including a pixel electrode;
a semiconductor layer provided in a layer below the display layer, the semiconductor layer including a wiring layer that includes a material removable by an etchant by which the pixel electrode is also removable; and
a terminal section configured to electrically connect the semiconductor layer to an external circuit, the terminal section including a first electrically-conductive layer made of a material same as a material of the wiring layer.

(2) The display unit according to (1), wherein
the semiconductor layer includes a gate electrode and a pair of source-drain electrodes, and
the terminal section is configured of the first electrically-conductive layer made of a material same as a material of one of the gate electrode and the pair of source-drain electrodes.

(3) The display unit according to (2), wherein
the semiconductor layer includes a multilayer wiring layer, and
the terminal section is configured of the first electrically-conductive layer made of a material same as a material of a metal film configuring the multilayer wiring layer.

(4) The display unit according to (3), wherein the terminal section is configured of one of the first electrically-conductive layer and a laminated structure including the first electrically-conductive layer and a second electrically-conductive layer, the first electrically-conductive layer being made of one or more materials same as the material of the gate electrode, the material of the pair of source-drain electrodes, and the material of the metal film, the second electrically-conductive layer including a material configuring the pixel electrode.

(5) The display unit according to (4), wherein
each of the pixel electrode and the second electrically-conductive layer in the terminal section has a laminated structure including a transparent electrode film and a reflective electrode film, and
the transparent electrode film in the second electrically-conductive layer configuring the terminal section includes an opening.

(6) The display unit according to any one of (1) to (5), wherein the terminal section has a protective film at least on both ends of the terminal section.

(7) The display unit according to any one of (1) to (6), wherein the etchant is one of an acetic-acid-phosphoric-acid-nitric-acid-based aqueous solution, a hydrofluoric-acid-nitric-acid-based aqueous solution, and an ammonia-hydrogen-peroxide-based aqueous solution.

(8) The display unit according to any one of (1) to (7), wherein the terminal section includes one or more of aluminum (Al), silver (Ag), and molybdenum (Mo).

(9) The display unit according to any one of (1) to (8), wherein the terminal section includes one or both of tantalum (Ta) and tungsten (W).

(10) The display unit according to any one of (1) to (9), wherein the terminal section includes one or more of titanium (Ti), titanium nitride (TiN), and copper (Cu).

(11) The display unit according to any one of (1) to (10), wherein one or both of the pixel electrode and the wiring layer have a configuration in which layers having different etching characteristics are laminated.

(12) The display unit according to any one of (1) to (11), wherein the pixel electrode has a configuration in which indium tin oxide (ITO) and one of aluminum (Al) and an aluminum alloy are laminated.

(13) The display unit according to any one of (1) to (12), wherein the wiring layer has a laminated structure in which a Ti layer, an Al layer, and a Ti layer are laminated in order.

(14) The display unit according to any one of (1) to (13), wherein the semiconductor layer includes a gate electrode, a semiconductor film, and a pair of source-drain electrodes in order, or includes a semiconductor film, a gate electrode, and a pair of source-drain electrodes in order.

(15) A method of manufacturing a display unit, the method including:
forming a wiring layer in a semiconductor layer on a substrate, and forming a first electrically-conductive layer in a terminal section, the first electrically-conductive layer being made of a material same as a material of the wiring layer;
forming, as a continuous film, a pixel electrode on the semiconductor layer and the first electrically-conducive layer, the pixel electrode configuring a display layer, and the pixel electrode being made of a material removable by an etchant by which the wiring layer is also removable; and
removing part or all of the pixel electrode on the first electrically-conducive layer to from the terminal section.

(16) The method according to (15), further including:
between the forming of the wiring layer and the first electrically-conducive layer and the forming of the pixel electrode,
forming, as a continuous film, a protective film on the wiring layer and the first electrically-conducive layer; and
removing the protective film on the wiring layer.

(17) The method according to (15) or (16), wherein the pixel electrode is formed as a second electrically-conducive layer on the first electrically-conducive layer, and subsequently, part or all of the pixel electrode is removed.

(18) The method according to (17), wherein
the pixel electrode is configured of a reflective electrode film and a transparent electrode film, and
the second electrically-conducive layer is formed by removing part or all of the transparent electrode from the pixel electrode.

(19) An electronic apparatus with a display unit, the display unit including:

a display layer including a pixel electrode;
a semiconductor layer provided in a layer below the display layer, the semiconductor layer including a wiring layer that includes a material removable by an etchant by which the pixel electrode is also removable; and
a terminal section configured to electrically connect the semiconductor layer to an external circuit, the terminal section including a first electrically-conductive layer made of a material same as a material of the wiring layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising:
a display layer including a pixel electrode;
a semiconductor layer provided in a layer below the display layer, the semiconductor layer including a wiring layer; and
a terminal section configured to electrically connect the semiconductor layer to an external circuit, the terminal section including a first electrically-conductive layer and a protective layer,
wherein the wiring layer and the first electrically-conductive layer each have a laminated structure including a first Ti layer, an Al layer, and a second Ti layer in order,
wherein the pixel electrode has a configuration in which a first pixel electrode layer including indium tin oxide (ITO) and a second pixel electrode layer including aluminum (Al) or an aluminum alloy are laminated, the second pixel electrode layer contacting the wiring layer, and
wherein the protective layer, in a cross-sectional view, covers a part of a top surface and side surfaces of the first electrically-conductive layer without covering top surfaces or side surfaces of the wiring layer.

2. The display unit according to claim 1, wherein the protective layer comprises SiN.

3. The display unit according to claim 1, wherein the terminal section further includes an insulating film that covers top and side surfaces of the protective layer.

4. The display unit according to claim 3, wherein the insulating film further covers a portion of the top surface of the first electrically-conductive layer.

5. The display unit according to claim 1, wherein the second pixel electrode layer does not contact the first electrically-conductive layer.

* * * * *